(12) United States Patent
Rohrbaugh et al.

(10) Patent No.: US 6,859,059 B2
(45) Date of Patent: Feb. 22, 2005

(54) SYSTEMS AND METHODS FOR TESTING RECEIVER TERMINATIONS IN INTEGRATED CIRCUITS

(75) Inventors: John G. Rohrbaugh, Fort Collins, CO (US); Jeffrey R. Rearick, Fort Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/737,435

(22) Filed: Dec. 16, 2003

(65) Prior Publication Data

US 2004/0130344 A1 Jul. 8, 2004

Related U.S. Application Data

(63) Continuation-in-part of application No. 10/125,338, filed on Apr. 18, 2002, now Pat. No. 6,762,614.

(51) Int. Cl.[7] .......................... G01R 31/02; G01R 31/26
(52) U.S. Cl. ..................... 324/763; 324/765; 702/117; 714/733
(58) Field of Search ....................... 324/73.1, 763–769, 324/158.1; 702/117–118, 120–121, 124, 126, 189; 714/30, 733–741; 326/13–14, 30–34, 58, 83

(56) References Cited

U.S. PATENT DOCUMENTS

| | | | |
|---|---|---|---|
| 5,117,129 A | 5/1992 | Hoffman et al. | |
| 5,682,392 A | 10/1997 | Raymond et al. | |
| 5,796,260 A | 8/1998 | Agan | |
| 5,977,775 A | 11/1999 | Chandler et al. | |
| 6,275,962 B1 | 8/2001 | Fuller et al. | |
| 6,324,485 B1 | 11/2001 | Ellis | |
| 6,365,859 B1 | 4/2002 | Yi et al. | |
| 6,396,279 B1 | 5/2002 | Gruenert | |
| 6,397,361 B1 | 5/2002 | Saitoh | |
| 6,448,865 B1 * | 9/2002 | Miller | 333/33 |
| 6,556,938 B1 | 4/2003 | Rohrbaugh et al. | |
| 6,577,980 B1 | 6/2003 | Shepston et al. | |
| 6,658,613 B2 * | 12/2003 | Rearick et al. | 714/724 |

OTHER PUBLICATIONS

Haulin, Tord, "Built–in Parametric Test for Controlled Impedance I/Os," Ericsson Telecom, pp. 123–128, no month/year.

Niggerneyer, et al., "Parametric Built–In Self–Test of VLSI Systems," Laboratory for Information Technology, (3 pages), no month/year.

* cited by examiner

Primary Examiner—Minh N. Tang

(57) ABSTRACT

Methods for testing integrated circuits (ICs) are provided. An exemplary method, in which the IC has a first pad configured as a signal interface for components external to the IC, the first pad having a receiver configured to receive an input signal from a component external to the IC, comprises: electrically interconnecting automated test equipment (ATE) with the IC; providing at least one stimulus to the IC such that the IC measures a receiver termination characteristic of the first pad; and receiving information corresponding to the receiver termination characteristic of the first pad. Systems and integrated circuits also are provided.

20 Claims, 19 Drawing Sheets

SYSTEMS AND METHODS FOR TESTING RECEIVER TERMINATIONS IN INTEGRATED CIRCUITS

CROSS-REFERENCE TO RELATED APPLICATIONS

This application is a continuation-in-part application claiming the benefit of and priority to U.S. patent application Ser. No. 10/125,338, entitled, "Systems and Methods for Facilitating Driver Strength Testing of Integrated Circuits," filed Apr. 18, 2002 now U.S. Pat. No. 6,762,614, which is entirely incorporated herein by reference.

BACKGROUND

Heretofore, integrated circuit (IC) devices have been tested and verified using a variety of test methods. For example, IC devices have been tested and verified to be defect-free using functional test vectors, such as those applied to the IC by the use of automated test equipment (ATE), which stimulate and verify the IC device functionality at the pin level of the device. A practical limitation to the utilization of ATE for testing ICs, however, is that the number of IC pins (or pads) that can be tested by a particular ATE has, heretofore, been limited by the physical configuration of the ATE. For instance, the number of pads of the IC to be tested may exceed the number of test channels provided by an ATE, or the number of pads may exceed the capacity of the ATE support hardware, such as by exceeding the maximum number of probes on a probe card, among others. As utilized herein, the term "pad" is used to refer collectively to both a physical site, which serves as an electrical contact for an IC, as well as circuitry associated with the physical site for enabling electrical communication between components of the IC and components external to the IC.

Additionally, performance limitations of a particular ATE may impose certain other testing restrictions. For example, the frequency of IC inputs and outputs may exceed the maximum frequency of the ATE, thereby limiting the test frequency of the IC to be tested to the maximum frequency of the ATE. Although configuring an ATE with additional test channels and/or a higher operating frequency may be accomplished, providing an ATE with an appropriately high pin count and/or an appropriately high operating frequency in order to eliminate the aforementioned deficiencies is, oftentimes, cost prohibitive.

In light of the foregoing and other deficiencies, it is known in the prior art to test IC devices utilizing a variety of "stop-gap" testing procedures, including: (1) connecting an ATE to less than all of the pins of an IC device; (2) connecting multiple pins of an IC device to a single ATE test channel; (3) testing the IC device in multiple passes of the ATE, with each pass testing a subset of the pins of the entire IC device; (4) testing the device at less than maximum frequency, and; (5) limiting, through design implementation, the pin count and/or frequency of the IC device to accommodate existing ATE, among others. As should be readily apparent, many of these "stop-gap" testing procedures may result in a loss of test coverage and, thereby, may lead to an increase in numbers of defective IC devices being shipped. Moreover, the practice of limiting, through design implementation, the pin count and/or frequency of the IC device to accommodate existing ATE is, oftentimes, an unacceptable constraint on IC design.

Therefore, there is a need for improved systems and methods which address these and/or other shortcomings of the prior art.

SUMMARY

Systems and methods for testing integrated circuits are provided. In this regard, an embodiment of a method for testing an integrated circuit (IC), in which the IC has a first pad configured as a signal interface for components external to the IC, the first pad having a receiver configured to receive an input signal from a component external to the IC, the method comprises: electrically interconnecting automated test equipment (ATE) with the IC; providing at least one stimulus to the IC such that the IC measures a receiver termination characteristic of the first pad; and receiving information corresponding to the receiver termination characteristic of the first pad.

An embodiment of an integrated circuit comprises a first pad and a first test circuit. The first pad electrically communicates with at least a portion of said IC, with the first pad having a first receiver configured to receive a first pad input signal from a component external to said IC and to provide, to a component internal to said IC, a first receiver digital output signal in response to the first pad input signal. The first test circuit is internal to said IC and being adapted to provide information corresponding to a receiver termination characteristic of the first pad.

Another embodiment of an integrated circuit comprises: a first pad electrically communicating with at least a portion of said IC, said first pad having a first receiver configured to receive a first pad input signal from a component external to said IC and to provide, to a component internal to said IC, a first receiver digital output signal in response to said first pad input signal; and means for providing information corresponding to a receiver termination characteristic of the first pad.

An embodiment of a system for testing an integrated circuit comprises automated test equipment (ATE) and an integrated circuit. The ATE is configured to electrically interconnect with an IC and to provide at least one stimulus to the IC. The IC has a first pad, said first pad having a first receiver and a first test circuit, said first receiver being configured to receive a first pad input signal from said ATE and to provide, to a component internal to said IC, a first receiver digital output signal in response to said first pad input signal. The first test circuit is configured to electrically communicate with said ATE such that, in response to receiving said at least one stimulus from said ATE, said first test circuit provides information, corresponding to a receiver termination characteristic of said first receiver of said first pad, to said ATE.

Other features and/or advantages will be or may become apparent to one with skill in the art upon examination of the following drawings and detailed description. It is intended that all such features and/or advantages be included herein within the scope of the disclosure as defined in the appended claims.

BRIEF DESCRIPTION OF THE DRAWINGS

The drawings are not necessarily to scale, emphasis instead being placed on clearly illustrating the principles of the present invention.

DETAILED DESCRIPTION

Figure 1:
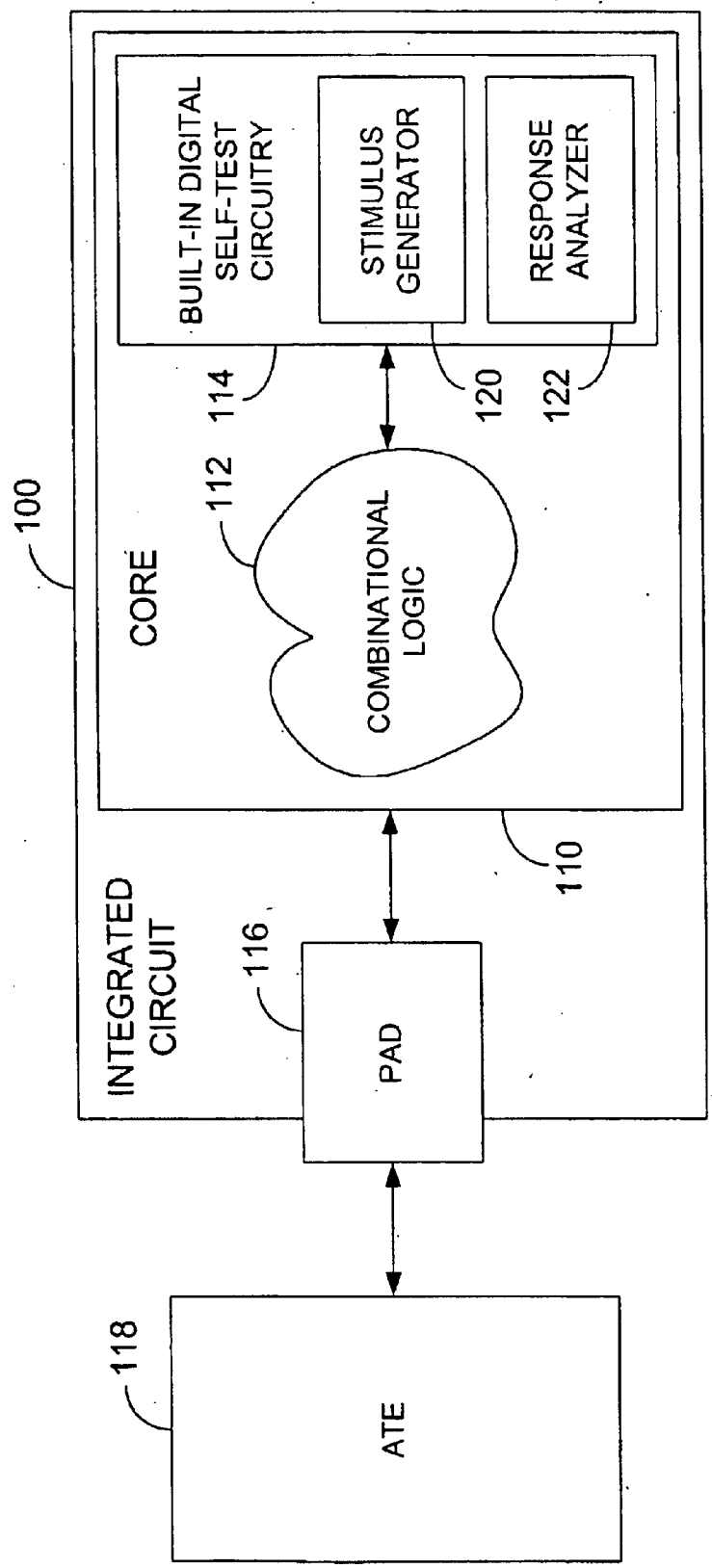
FIG. 1 is a schematic diagram depicting a representative integrated circuit incorporating digital self-test circuitry of the prior art.

Reference will now be made in detail to the description of the invention as illustrated in the drawings, with like numerals indicating like parts throughout the several views. As mentioned briefly hereinbefore, it is known to incorporate built-in (digital) self-test circuitry into an integrated circuit. Referring now to FIG. 1, a representative integrated circuit 100 incorporating such built-in self-test circuitry will be described in greater detail, so as to facilitate a more thorough understanding of the present invention.

As shown in FIG. 1, integrated circuit 100 includes a core 110 which incorporates logic 112 and digital self-test circuitry 114. Core 110 electrically communicates with pad 116 which is configured to electrically communicate with devices external to the integrated circuit, such as a piece of automated test equipment (ATE) 118, for example. So configured, signals provided from an external device, e.g., ATE 118, may be delivered to the core 110 via a transmission path which includes pad 116.

As is known, digital self-test circuitry 114 is configured to provide functional-based digital testing of logic circuitry contained within core 110. In order to accomplish such testing, digital self-test circuitry 114 typically incorporates a stimulus generator 120 and a response analyzer 122. More specifically, stimulus generator 120 is configured to provide one or more test patterns for testing logic circuitry of the core. The pattern or patterns provided to the logic circuitry are comprised of digital data, i.e., zeros and ones. In response to the various patterns, the logic circuitry under test then provides a response signal or signals to the response analyzer 122 that is able to interpret the response and provide a test result signal, which may be provided externally of the integrated circuit. Thus, the digital self-test circuitry provides for digital, functional testing of the core by applying digital test patterns to the logic circuitry of the core and has, heretofore, substantially removed the need for external test equipment, i.e., ATE 118, to provide stimulus to and check responses from the integrated circuit for facilitating testing of the digital logic circuitry.

Figure 2:
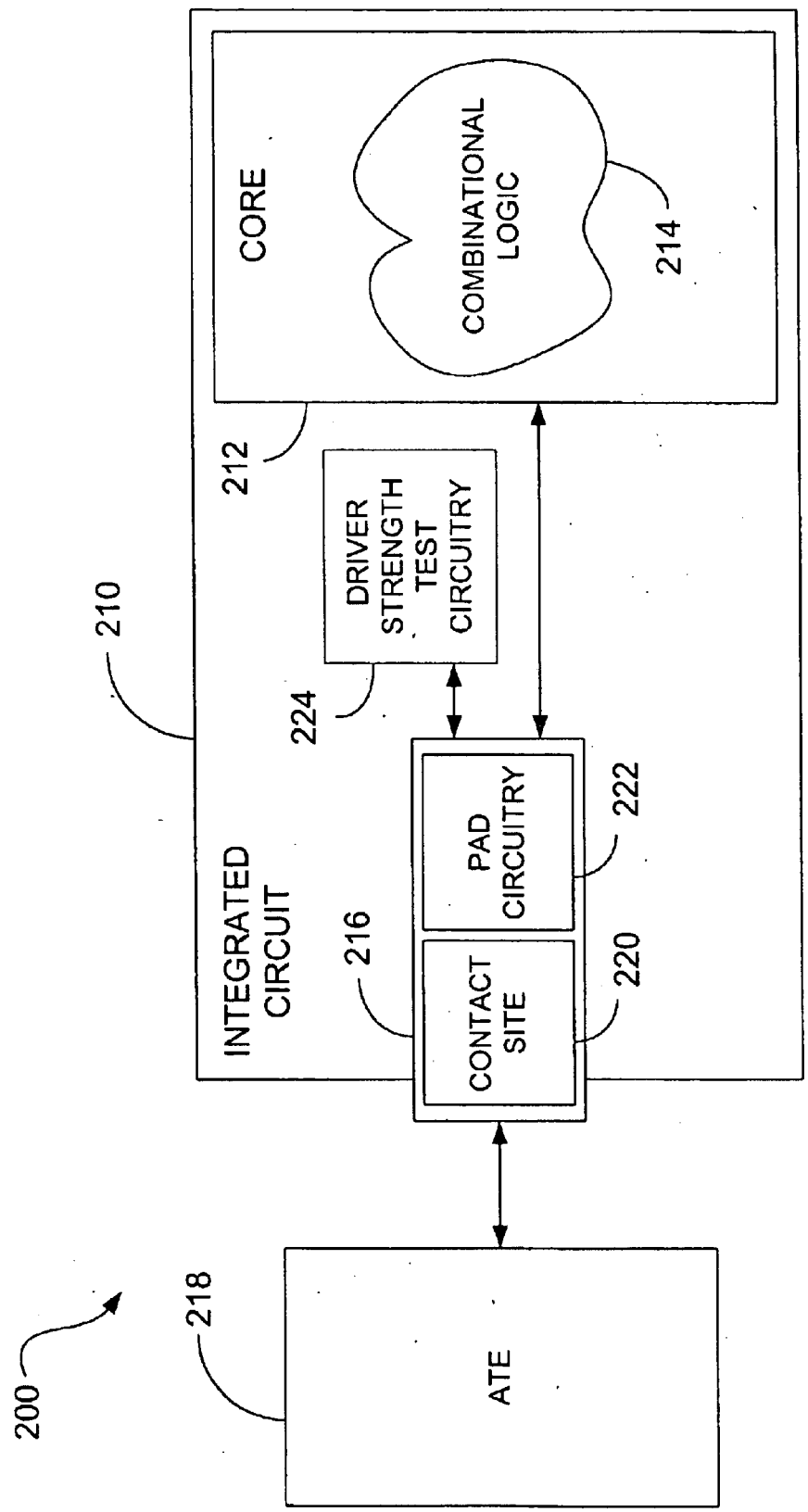
FIG. 2 is a schematic diagram depicting an embodiment of a test system.

Utilizing the digital self-test circuitry of FIG. 1 as a point of comparison, general characteristics of an embodiment of a test system will now be described with reference to the schematic diagram of FIG. 2. As depicted in FIG. 2, driver strength test system 200 incorporates an integrated circuit 210 that includes a core 212. Core 212 incorporates logic 214 and electrically communicates with a pad 216, which is configured to allow intercommunication of the logic with devices, such as ATE 218, for example, external to the integrated circuit. As mentioned hereinbefore, a pad, such as pad 216, includes a physical or contact site 220, which serves as an electrical contact for IC 210, as well as pad circuitry 222, which cooperates with the contact site to enable electrical communication between components of the IC and components external to the IC. As is known, pad circuitry may include one or more of a receiver, for receiving signals provided to the pad, and a driver, for providing signals to external devices.

Additionally, integrated circuit 210 incorporates driver strength test circuitry 224 that electrically communicates, either directly or indirectly, with pad 216. As described in detail hereinafter, test circuitry, such as driver strength test circuitry 224, is configured to provide selected ATE functionality and, thereby, potentially reduces the necessity for specialized external automated test equipment for testing integrated circuits of various configurations. It should be noted that, although driver strength test circuitry 224 is depicted in FIG. 2 as residing outside core 212 and outside the pad 216, various other arrangements of test circuitry may be utilized, such as arranging the test circuitry within the core or within the pad, for instance. Moreover, the test circuitry may be configured to communicate with the ATE via a pad other than the pad to be tested, i.e., a pad other than pad 216.

As mentioned hereinbefore, ATE typically provides the ability to test a wide variety of integrated circuits. Oftentimes, however, the full testing capability of a given ATE is usually not required to test a specific type of integrated circuit. Additionally, the number of pads of an integrated circuit may exceed the number of test channels of a given ATE, thereby necessitating the use of an ATE with an increased number of tester channels or necessitating the use of less than optimal testing procedures, e.g., testing fewer than all of the pads of an integrated circuit simultaneously, for instance.

By providing test circuitry "on-chip," the testing of integrated circuits, such as integrated circuit 210, may be implemented utilizing conventional ATE, whereby test capability not typically provided by the conventional ATE may be provided by the driver strength test circuitry. So provided, the driver strength test circuitry has the ability to provide testing capability that a given ATE does not provide, or is not able to provide, while utilizing various capabilities that a given ATE does provide. Thus, testing systems, such as testing system 200, may facilitate efficient and effective testing of integrated circuits that draws from at least some of the inherent strengths of conventional ATE, e.g., reduced costs, while providing potentially improved testing performance.

By utilizing the test circuitry, testable pin count of an integrated circuit is not necessarily limited by the ATE, such as by the tester channel configuration of a given ATE. For instance, the ATE may provide signals, such as scan test signals and resets, for example, to some pads of an integrated circuit under test, while leaving other pads to be tested by the driver strength test circuitry. Additionally, utilization of the test circuitry makes it possible to test the integrated circuits at frequencies greater than the test frequency limit of the ATE.

Figure 3:
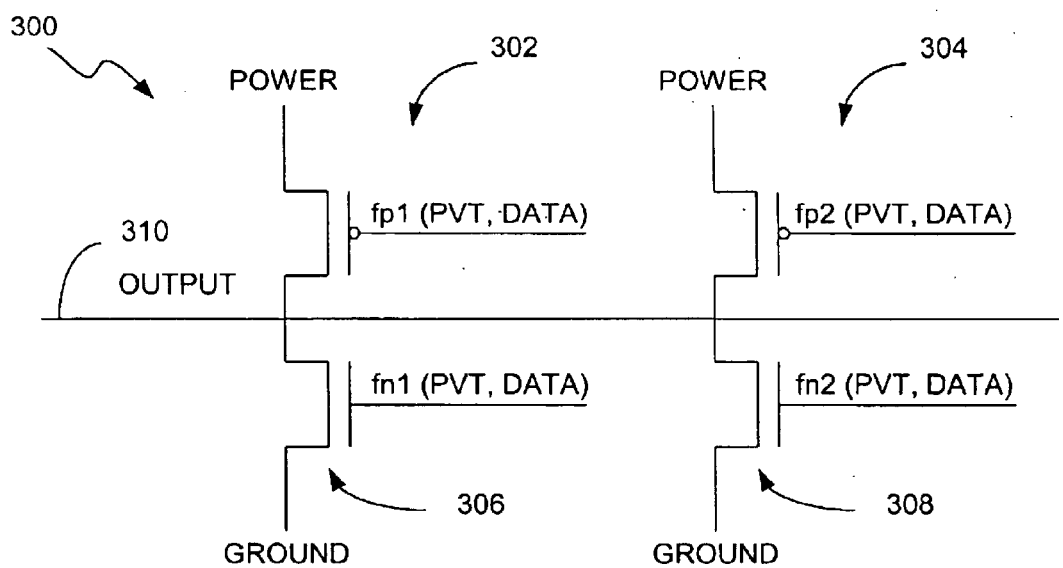
FIG. 3 is a schematic diagram depicting detail of an embodiment of a driver circuit.

As mentioned hereinbefore, embodiments of the test circuitry can facilitate driver strength testing of pads of integrated circuits and, in some embodiments, facilitate such testing, at least in part, with the use of "on-chip" components. In this regard, typical pad driver circuits are implemented with several parallel transistors that can pull the pad up to the power supply (logic "1"), and several parallel transistors that can pull the pad down to ground (logic "0"). In CMOS processes, P-type transistors are usually used to pull up to the positive power supply, and N-type transistors are usually used to pull down to ground. The use of parallel transistors allows not only greater drive strength, but also the tuning of drive strength based on control circuits that are sensitive to process, voltage, and temperature (PVT). Additionally, it is common practice to qualify the driver data with one of several bits of PVT information for each pullup and pulldown transistor in the driver, as shown in FIG. 3. These PVT signals are typically generated centrally and distributed around the IC to each pad.

In FIG. 3, pad driver circuit 300 includes two P-type transistors 302 and 304, and two N-type transistors 306 and 308. The transistors 302 and 304 each are coupled between a respective power source and output 310. The transistors 306 and 308 each are coupled between a ground and output 310.

To assure the proper fabrication and operation of a pad driver circuit, the output drive current should be measured. This is often called a "driver strength test." Driver circuits can be defective in either direction (pullup or pulldown). Thus, a driver strength test typically consists of two portions, i.e., one measuring and/or verifying the current of the pullup device(s) and another measuring and/or verifying the current of the pulldown device(s).

Typically, current systems are measured by automated test equipment (ATE) systems that employ ammeters in parametric measurement units (PMUs) that can be connected to a pad to verify that the drive current is above a specified lower limit. Unfortunately, as mentioned before, for ICs with pin counts that exceed the number of available tester channels, ATE cannot be used to measure drive currents on all pads. The subset of pads that are contacted by the ATE can be tested, but that technique leaves many other pads untested, risking undetected defects. The present invention potentially solves this problem by providing test circuitry on-chip, e.g., providing measurement circuitry within the driver circuit to enable verification that driver strength meets a specification to a certain degree of accuracy.

Figure 4:
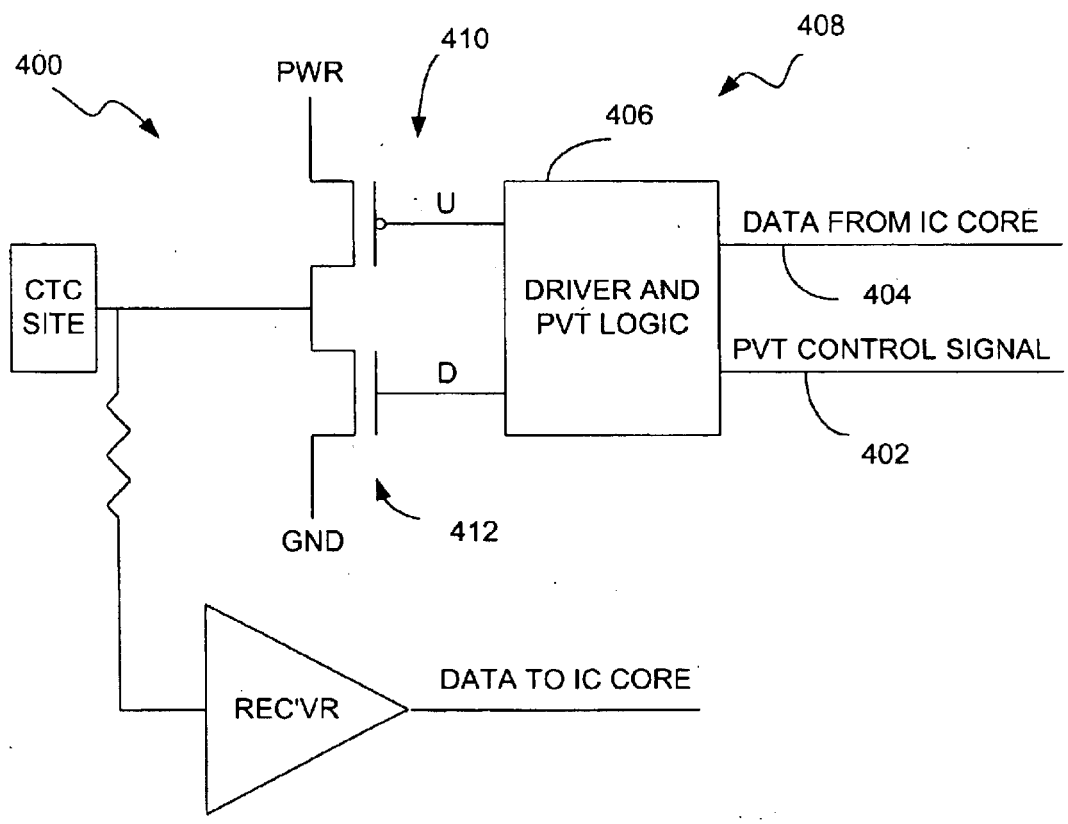
FIG. 4 is a schematic diagram depicting detail of an embodiment of a driver circuit.

A representative pad 400 that includes a driver and receiver is shown in FIG. 4. As shown in FIG. 4, PVT signals 402 and the individual driver data 404 are combined in a logic circuit 406 that resides inside each driver circuit 408. The logic circuit generates individual "up" and "down" signals that drive the gates of a representative pair of output transistors 410 and 412.

Figure 5:
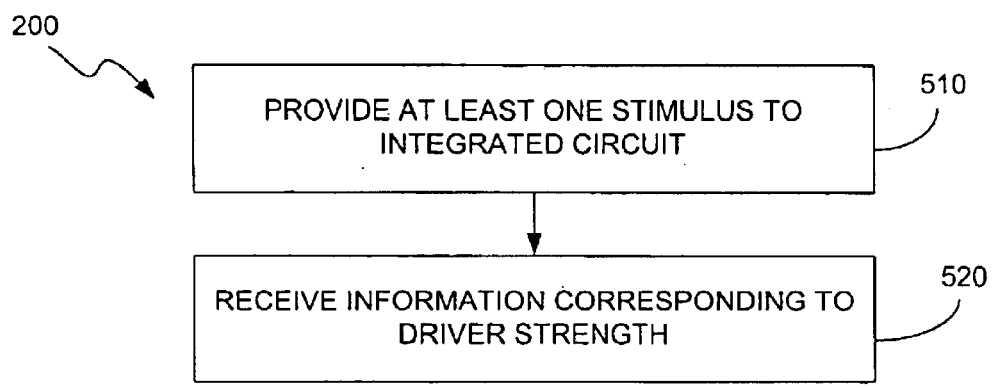
FIG. 5 is a flowchart depicting the functionality of an embodiment of the test system of FIG. 2.

Reference will now be made to the flowchart of FIG. 5, which shows the functionality and/or operation of an implementation of the test system of the present invention. As shown in FIG. 5, the test system or method 200 may be construed as beginning at block 510, where at least one stimulus is provided to an IC. In block 520, information corresponding to the drive strength of a driver of the IC is received.

Figure 6A:
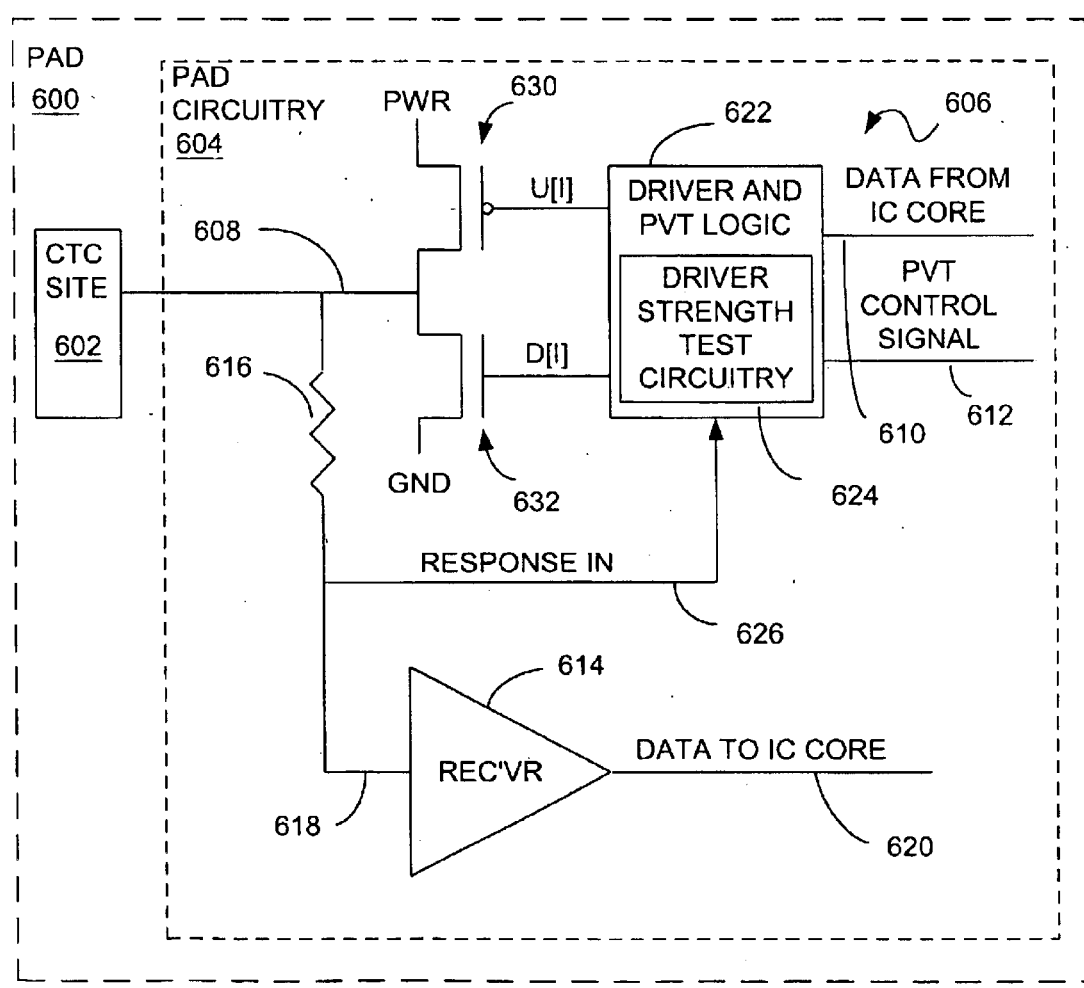
FIG. 6A is a schematic diagram of an embodiment of a pad.

Reference will now be made to FIG. 6A, which depicts an embodiment of an integrated circuit of the present invention. As shown in FIG. 6A, a pad 600 of an integrated circuit includes both a contact site, e.g., contact site 602, and pad circuitry associated with the contact site, e.g., pad circuitry 604. Circuitry 604 includes a driver 606 that electrically communicates with the contact site 602, such as by lead 608. Driver 606 is configured to receive a data signal 610 from the IC core, a PVT control signal 612, and a driver tristate enable signal (not shown) from the IC core. Driver 606 also is electrically interconnected to a receiver 614 with an optional resistor 616 being coupled therebetween. Receiver 614 is configured to receive an input, such as via lead 618, and is configured to provide an output, such as via lead 620, to the IC core of the integrated circuit.

As mentioned before, driver 606 includes driver and PVT logic 622 as well as driver strength test circuitry 624. Additionally, driver 606 includes one or more P-type transistors 630 and one or more N-type transistors 632. Driver response 626 ("response in") is provided to the driver strength test circuitry 624. The driver strength test circuitry 624 is described in detail in FIG. 6B.

Figure 6B:
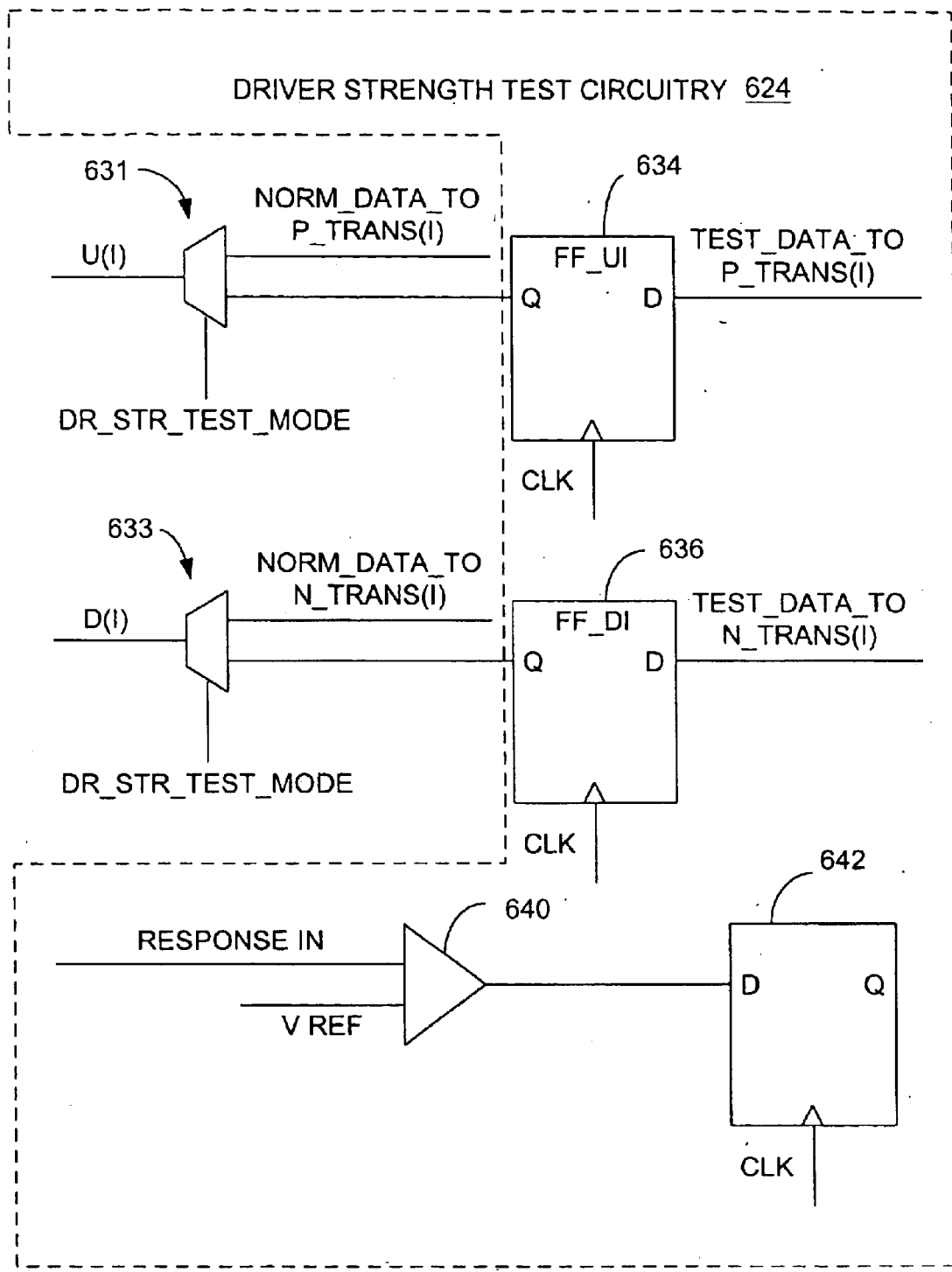
FIG. 6B is schematic diagram of an embodiment of driver strength test circuitry.

As shown in FIG. 6B, the gate of each output transistor in the driver is connected to an output (U[I] for P-type transistors and N[I] for N-type transistors) of the driver strength test circuitry 624. These signals are produced by mutiplexers 631 and 633, which select between the normal driver data and the test driver data based on the control signal DR_STR_TEST_MODE. The source of the test driver data for each transistor in the driver can be a scan register, as shown. In particular, control signal U[I] is driven by multiplexer 631 which communicates with scan register 634, and control signal D[I] is driven by multiplexer 633 which communicates with scan register 636. A comparator 640 receives an output of the pad driver as well as a reference voltage VREF, and provides a data signal to a scan register 642.

Using the representative embodiment of the driver strength test circuitry of FIGS. 6A and 6B, driver strength for pullup current may be obtained by selecting a p-transistor (or set of p-transistors) in a given driver. An n-transistor (or set of n-transistors) of the same driver, the resistance of which is greater than that of the p-network by a specified margin, also is selected. Data is then scanned into the scan registers of the test circuitry that will activate the chosen transistors. By setting the dr_str_test mode signal to a "1," the drivers can be controlled by the scan registers of the test circuitry. The voltage of the output node then can be compared with a reference voltage (VREF in this example). The output of the comparator then can be scanned into scan register 642 and the output observed (should be a logic "1" in this example, assuming that VREF=VDD/2).

Similarly, a driver strength for pulldown current may be obtained by selecting an n-transistor (or set of n-transistors) in a given driver. A p-transistor (or set of p-transistors) in the same driver, the resistance of which is greater than that of the n-network by a specified margin, also is selected. Data is then scanned into the scan registers of the test circuitry that will activate the chosen transistors. The dr_str_test_mode signal is set to a "1" to cause the drivers to be controlled by the scan registers in the test circuitry. The voltage of the output node then can be compared with a reference voltage (VREF in this example). The output of the comparator then can be provided to scan register 642 and observed (should be a logic "0" in this example, again assuming that VREF=VDD/2).

The aforementioned tests can be repeated as desired with any subset and/or combination of n- and p-transistors. The range of output voltages should allow characterization of the strength of each target transistor with respect to the available opposing transistor(s).

In some implementations, the driver and PVT logic circuitry inside each pad are combined with the test multiplexers. A "dr_str_test_mode" control (see FIG. 6C) then can be used to force the driver into test mode. In this mode, the PVT control signals act as the test data for each transistor, thus reducing or eliminating the need for the scan registers for the test data. This can result in the circuit having much lower area penalty. Some additional logic and/or scan registers may be required depending on the degree of flexibility desired for activating combinations of n- and p-transistors.

Figure 6C:
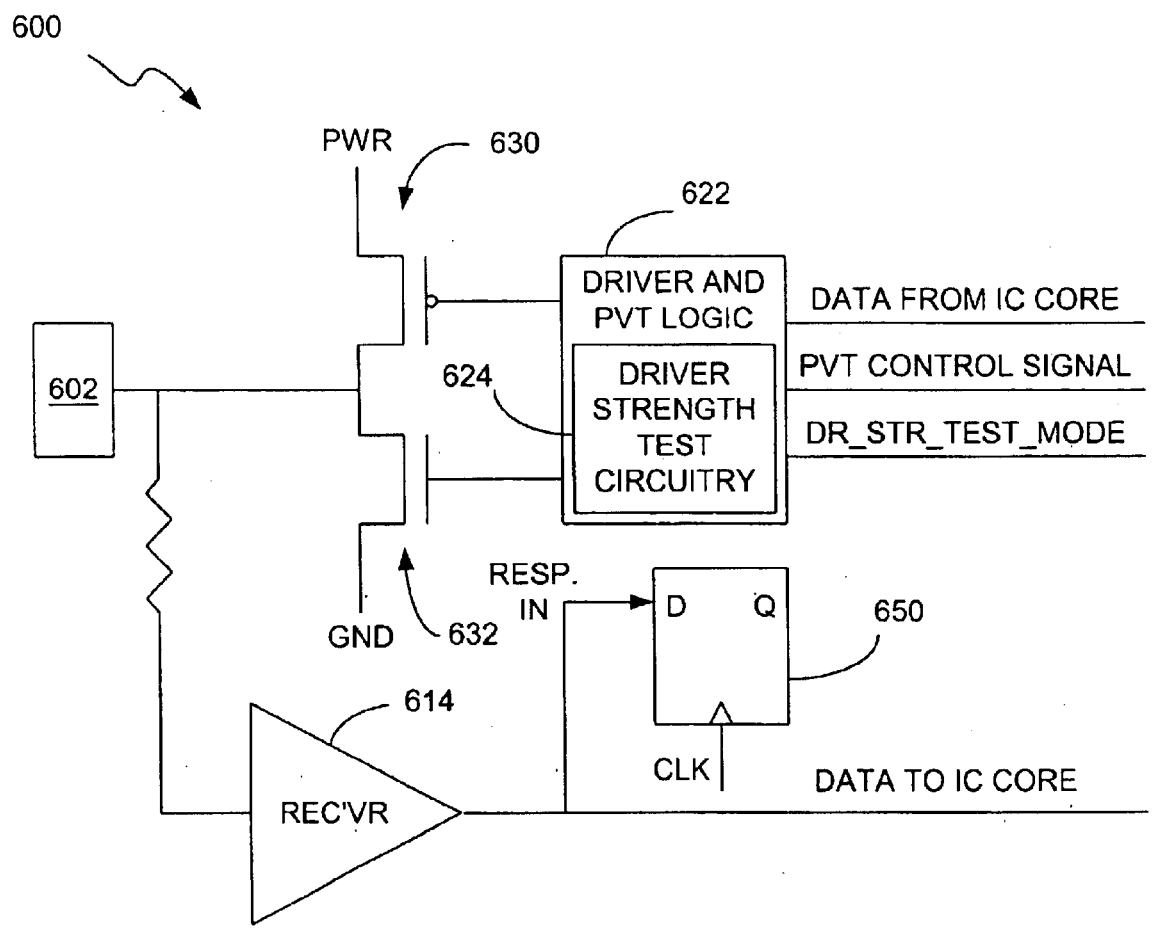
FIG. 6C is a schematic diagram depicting another embodiment of a pad.

Also in some implementations, such as depicted in FIG. 6C, the receiver circuit, e.g., receiver 614, associated with the driver circuit can be used as the comparator so as not to incur any additional area penalty. In this configuration, the scan register, e.g., scan register 650, associated with the receiver can be used to capture the receiver output. Since each receiver typically has its own scan register (as per IEEE Standard 1149.1, for example), all the pads can be tested simultaneously. Such a use of the existing scan register also minimizes the area penalty by eliminating the need for a dedicated comparator (640) and scan register (642) as shown in FIG. 6B. However, this implementation relies on the fixed threshold of the receiver (usually near VDD/2) to distinguish logic 0 from logic 1.

Since the nature of a pad driver is to either drive high or drive low, but not both at the same time, pad designs may require extra logic to support at least some embodiments of the invention. Alternatively, one proposed change to the test environment can be made to allow pairs of pads to be tested with relatively little change to the pad circuitry, as shown in FIG. 6D.

Figure 6D:
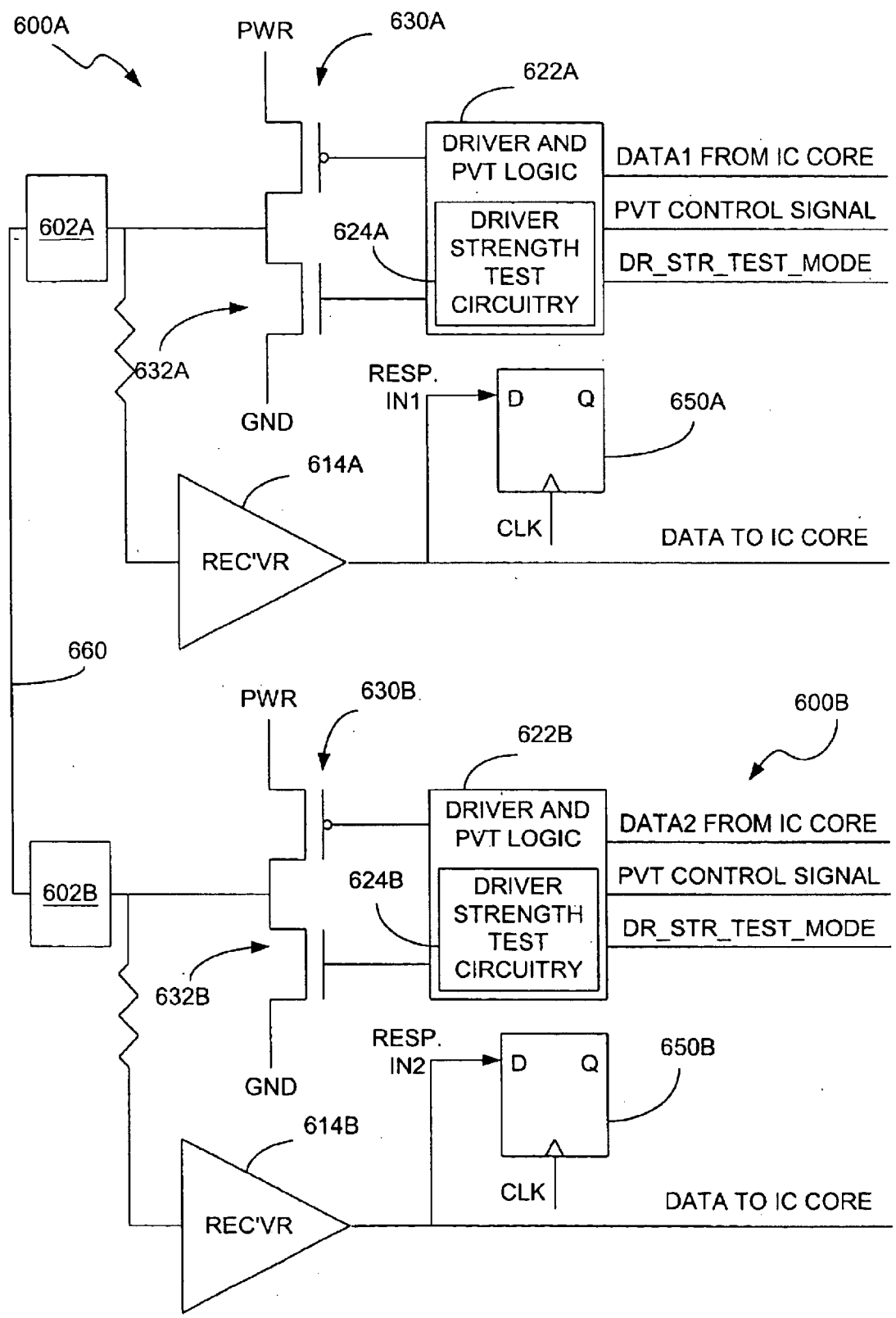
FIG. 6D is a schematic diagram depicting electrically intertwined pads of an embodiment.

In FIG. 6D, two pads, e.g., pads 600A and 600B, of the same circuit type are connected externally with a jumper wire 660. An inter-pad driver strength test for pullup current can then be obtained by selecting a p-transistor (or set of p-transistors) in a given driver. An n-transistor (or set of n-transistors) in the jumpered driver is also selected, the resistance of which is greater than that of the p-network by a specified margin. Data is then scanned into the scan registers in the test circuitry that will activate the chosen transistors. The dr_str_test_mode signal can be set to a "1" to cause the drivers to be controlled by the scan registers in the test circuitry. The voltage of the output nodes then can be compared with a reference voltage (VDD/2, the receiver's native trip level, in this example). The outputs of the comparators can be sampled into scan registers and observed (should both be logic "1" in this example).

An inter-pad driver strength test for pulldown current can be obtained by selecting an n-transistor (or set of n-transistors) in a given driver. A p-transistor (or set of p-transistors) in the jumpered driver is also selected, the resistance of which is greater than that of the n-network by a specified margin. Data is then scanned into the scan registers in the test circuitry that will activate the chosen transistors. The dr_str_test_mode signal is set to a "1" to cause the drivers to be controlled by the scan registers in the test circuitry. The voltages of the output nodes then can be compared with a reference voltage (again VDD/2 in this example), and the outputs of the comparators can be sampled into scan registers and observed (should both be logic "0" in this example).

Since driver strength testing can cause logic contention, driver design should be done with care to assure that the high currents involved do not cause damage to the circuitry. As a cautionary measure, the jumper wire described with respect to FIG. 6D can be replaced with current limiting resistor. Note that the calculations for the output voltages at pad 600A and pad 600B nodes should take this resistance into account in order to predict the correct results.

Note that in the some implementations, the trip level of the receiver is generally fixed at VDD/2, which could limit the number of data points from logic contentions that can be gathered compared to the more general comparator solution. One easily-implemented extension to the preferred implementation is the use of a receiver with hysteresis that extends the range of voltage levels that can be used in resolving contentions between other combinations of p- and n-transistors.

When an IC has a high pin count, it is overwhelmingly likely that there are many occurrences of the same pad driver circuit type used for different signals. The present invention can make use of that fact to assess the accuracy of the driver strength measurement circuit. If one signal connected to a given pad driver circuit type is contacted by ATE, the PMU can be used to accurately measure the current sourcing and sinking abilities of the pullup and pulldown transistors, respectively. These values will be largely identical for all other copies of this pad type, subject only to the variation of the IC process, which tends to be small in any given area of the circuit. Thus, for a group of pad driver circuits of a given type that are near each other in the circuit, the measurement of one ATE-contacted member can be used to reliably infer the values for the other non-contacted members, thereby allowing the pass/fail results from the scan registers sampling the pad voltages of non-contacted pads to represent actual current specification values.

Figure 6E:
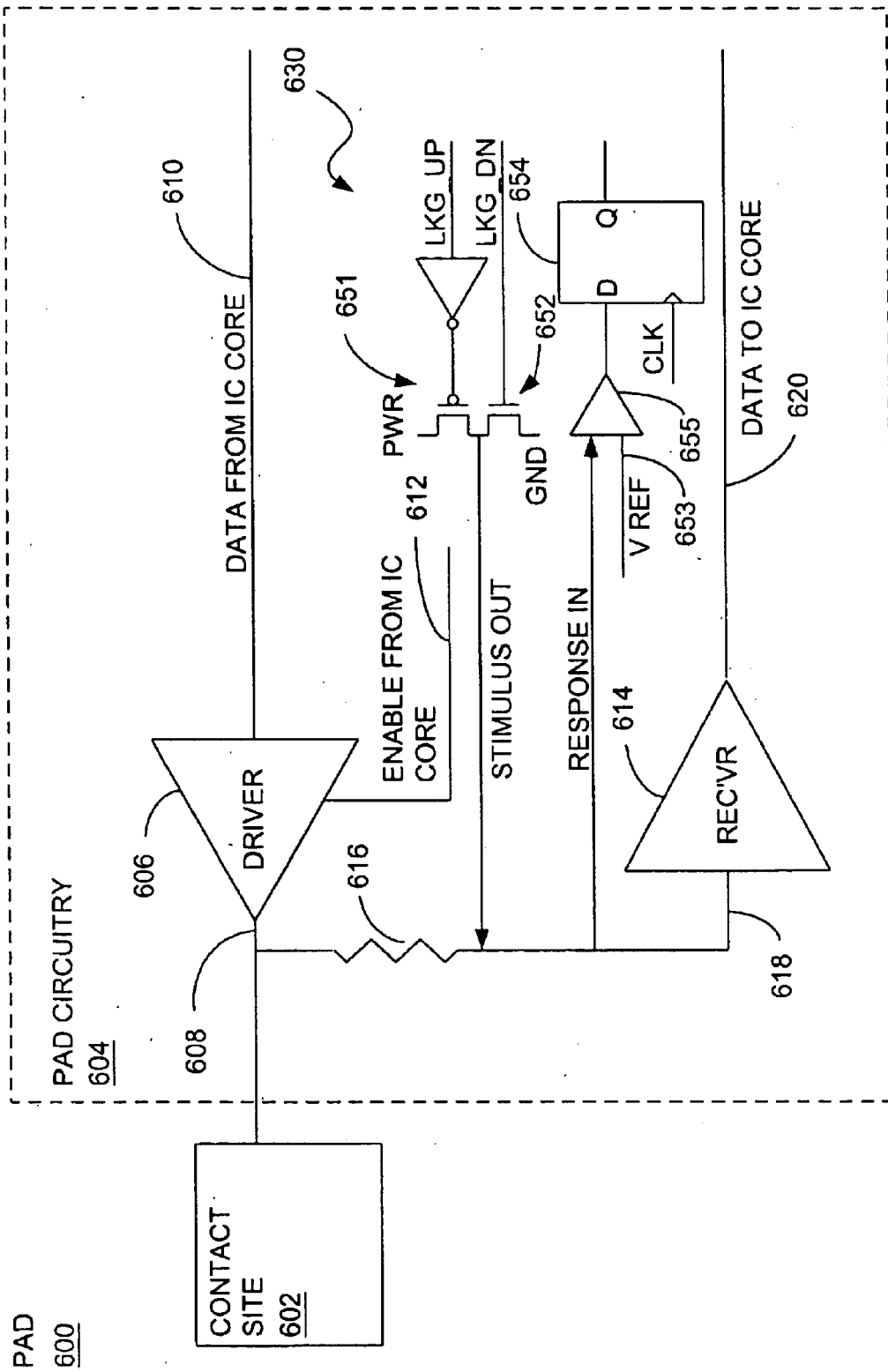
FIG. 6E is a schematic diagram depicting an alternative embodiment.

Referring now to FIG. 6E, another embodiment of driver strength test circuitry 624 will be described in greater detail. This alternative embodiment for driver strength testing makes use of test features in the circuit that are intended to test the tristate leakage of the driver. As depicted in FIG. 6E, driver strength test circuitry 624 is based on a simple ratioed-logic circuit. More specifically, a small transistor (either p-type transistor 651 or n-type transistor 652) is activated to oppose the tristated driver's leakage current, and the resulting voltage is compared to a reference 653 by a comparator 655, with the result of the comparison being captured in a scan register 654 for later observation. However, instead of using these small transistors to oppose the driver's tristate leakage current, they will instead be used to oppose the driver's active current.

To test the tristate leakage current of the driver's pull-up device(s), the driver's output is initialized to a "1" by setting enable and data to "1." Then, the driver's data input is kept at "1" while the enable signal is set to "0." A pull-down type transistor 652 is activated by a test signal ("lkg_dn") tied to its gate. This n-type type transistor is sized such that its on-resistance is less than the off-resistance of the large p-type driver transistor(s), as quantified by the tristate leakage current specification. Thus, if the p-type driver is truly in the high impedance state, the lkg_dn pull-down transistor (652) will be sufficient to pull the output node to logic "0." If, however, the p-type driver is not in the high impedance state, or if a defect is present that causes excessive leakage, then the lkg_dn pull-down transistor will be insufficient to pull the output node down. Therefore, an incorrect logic "1" value will be sampled on the output node.

To test the tristate leakage current of the driver's pull-down device(s), the driver's output is initialized to "0" by setting enable to "1" and data to "0." Then, the driver's data input is kept at "0" while the enable signal is set to "0." A pull-up p-type transistor 651 is activated by the inverse of a test signal ("lkg_up") tied to its gate. This p-type transistor is sized such that its on-resistance is less than the off-resistance of the large n-type driver transistor(s), as quantified by the tristate leakage current specification. Thus, if the n-type driver is truly in the high impedance state, the lkg_up pull-up transistor (651) will be sufficient to pull the output node to a logic "1." If, however, the n-type driver is not in the high impedance state, or if a defect is present that causes excessive leakage, then the lkg_up pull-up transistor will be insufficient to pull the output node up. Therefore, an incorrect logic "0" value will be sampled on the output node.

Figure 6F:
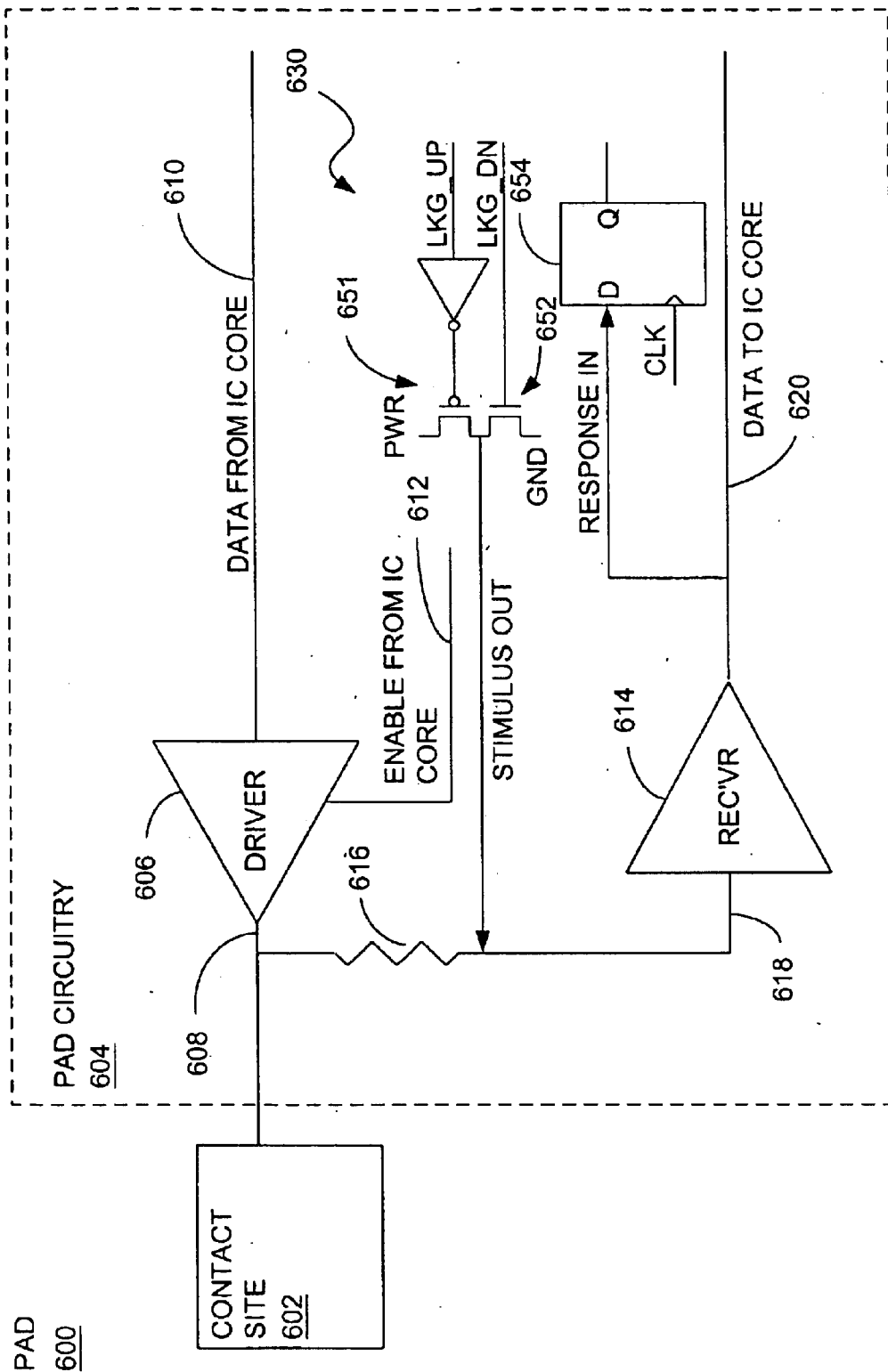
FIG. 6F is a schematic diagram depicting a variant of the alternative embodiment.

In some implementations, the receiver circuit associated with the tristate driver circuit is used as the comparator so as not to incur any additional area penalty. FIG. 6F is a schematic diagram depicting such an implementation. In this configuration, the scan register 654 associated with the receiver is used to capture the receiver output. Since each receiver typically has its own scan register (as per IEEE standard 1149.1), all the pads can be tested simultaneously.

Note, the previous circuit(s) identify when a driver's current is above a specified value(s), as codified by the size of the lkg_dn and the lkg_up transistors, which can be logged as a test failure. Measurement circuits also can be extended to allow the failure threshold to be changed, which allows adjustment of the preset current failure limit, as well as allowing a range of values of defective currents to be measured. This can be done by adding additional pairs of lkg_up and lkg_dn transistors, such as in parallel to the original set or in series with the original set. Additionally, each set can include unique control signals (lkg_up_2 and lkg_dn_2, for example).

Note, that the sizing of each pair of lkg_up and lkg_dn transistors can be unique and specifically weighted such that turning on various combinations can allow a wide variety of current threshold measurements. For example, if three pairs of parallel transistors are used, and the sizes of each pair are a factor of two greater than the previous pair, and the first pair is sized to source/sink 1 $\mu$A, then the following eight pairs of measurement thresholds can be achieved:

| 1 kg_dn_3 | 1 kg dn_2 | 1 kg_dn_1 | current_threshold |
|---|---|---|---|
| 0 | 0 | 0 | off: normal operation |
| 0 | 0 | 1 | +1 $\mu$A |
| 0 | 1 | 0 | +2 $\mu$A |

-continued

| | | | |
|---|---|---|---|
| 0 | 1 | 1 | +3 $\mu$A |
| 1 | 0 | 0 | +4 $\mu$A |
| 1 | 0 | 1 | +5 $\mu$A |
| 1 | 1 | 0 | +6 $\mu$A |
| 1 | 1 | 1 | +7 $\mu$A |

| 1 kg_up_3 | 1 kg_up_2 | 1 kg_up_1 | current_threshold |
|---|---|---|---|
| 0 | 0 | 0 | off: normal operation |
| 0 | 0 | 1 | −1 $\mu$A |
| 0 | 1 | 0 | −2 $\mu$A |
| 0 | 1 | 1 | −3 $\mu$A |
| 1 | 0 | 0 | −4 $\mu$A |
| 1 | 0 | 1 | −5 $\mu$A |
| 1 | 1 | 0 | −6 $\mu$A |
| 1 | 1 | 1 | −7 $\mu$A |

It should be understood that the positive current thresholds represent the p-type transistors(s) in the pad driver sourcing current, and the negative current thresholds represent the n-type transistor(s) in the pad driver circuit sinking current. It should also be clear that only one type of measurement (sourcing or sinking) can be made at any given time and that the control signals for the other sense should be held in their inactive state. For example, if any one or more of the three lkg_dn control signals is active, i.e., set to "1", then all three of the lkg_up control signals should be off, i.e., set to "0".

When an IC has a high pin count, it is overwhelmingly likely that there are many occurrences of the same pad driver circuit type used for different signals. The present invention can make use of that fact to assess the accuracy of the current measurement circuit. If one signal connected to a given pad driver circuit type is contacted by the ATE, the nanoammeter in the PMU of the ATE can be used to accurately measure the current sourcing and sinking abilities of the lkg_up and lkg_dn transistors, respectively. These values will be largely identical for all other copies of this pad type, subject only to the variation of the IC process, which tends to be small in any given area of the circuit. Thus, for a group of pad driver circuits of a given type that are near each other in the circuit, the measurement of one ATE-contacted member can be used to reliably infer the values for the other non-contacted members, thereby allowing the pass/fail results from the scan registers sampling the pad voltages of non-contacted pads to represent actual current specification values.

Figure 7:
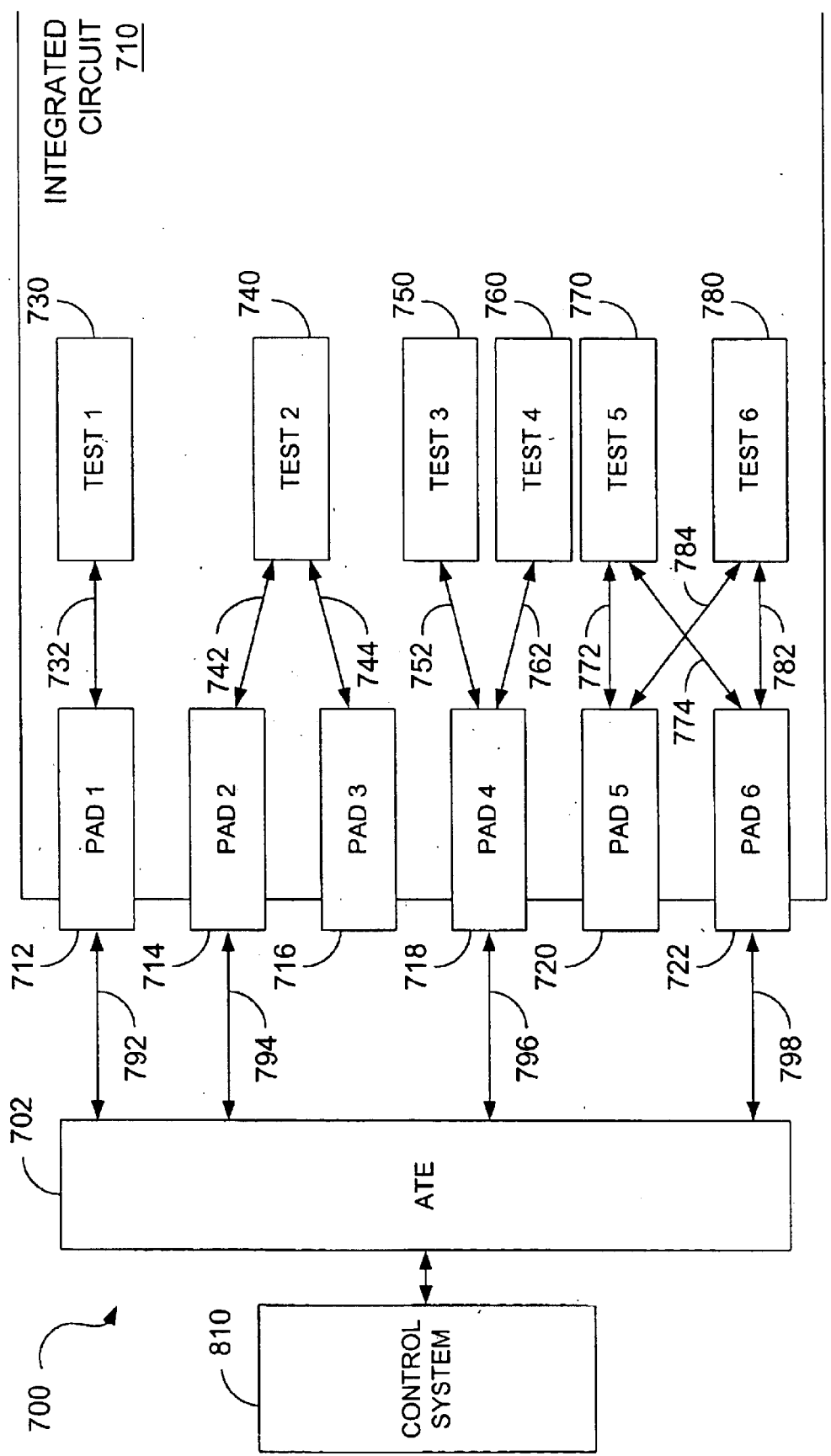
FIG. 7 is a schematic diagram depicting the context of the embodiment.

Referring now to FIG. 7, various aspects, including test circuitry implementation and calibration, will now be described in greater detail. As shown in FIG. 7, an embodiment 700 of the present invention incorporates an integrated circuit 710 which includes multiple pads. In particular, integrated circuit 710 includes pads 1 through 6 (712, 714, 716, 718, 720 and 722, respectively). As depicted in FIG. 7, the integrated circuit also incorporates various test circuits, such as Test 1 (730), Test 2 (740), Test 3 (750), Test 4 (760), Test 5 (770) and Test 6 (780). The various test circuits electrically communicate with their respective pads in a variety of configurations. For instance, circuitry 730 communicates directly with pad 712 via transmission path 732 (in a some implementations, path 732 may be two unidirectional paths); circuitry 740 communicates with each of pads 714 and 716 by utilizing transmission paths 742 and 744, respectively; circuitry 750 and circuitry 760 each electrically communicate with pad 718 via transmission paths 752 and 762, respectively; circuitry 770 communicates with pads 720 and 722 via transmission path 772 and 774, respectively; and circuitry 780 also communicates with pads 720 and 722, albeit, via transmission path 782 and 784, respectively. Thus, an integrated circuit may incorporate various pad types as well as various configurations of intercommunication between the various pads and various test circuits.

As an illustrative example, and not for the purpose of limitation, an integrated circuit may be configured to utilize one test circuit to test multiple pads, e.g., utilizing one driver strength test circuit to test multiple pads of like type. Such a configuration is represented schematically in FIG. 7 by Pad 2 and Pad 3, which are both tested by Test 2.

As shown in FIG. 7, ATE 702 electrically communicates with the test circuitry of integrated circuit 710 by utilizing a variety of transmission path configurations. For example, circuitry 730 communicates with the ATE via transmission path 732, pad 712 and transmission path 792; circuitry 740 communicates with the ATE via transmission path 742, pad 714 and transmission path 794; circuitry 750 communicates with the ATE via transmission path 752, pad 718 and transmission path 796; circuitry 760 communicates with the ATE via transmission path 762, pad 718 and transmission path 796; circuitry 770 communicates with the ATE via transmission path 774, pad 722 and transmission path 798; and circuitry 780 communicates with the ATE via transmission path 782, pad 722 and transmission path 798. Additionally, various functionality may be enabled by control system 810 (described in detail hereinafter).

As described hereinbefore, the present invention is adapted to facilitate automated test equipment functionality for testing integrated circuits. In this regard, some embodiments may be construed as providing driver strength test systems for testing integrated circuits. More specifically, some embodiments of the driver strength test system may include one or more driver strength test circuits in combination with ATE, e.g., ATE 702 of FIG. 7, and a suitable control system, which may be implemented by control system 810 of FIG. 7, for example. The control system may be implemented in hardware, software, firmware, or a combination thereof. In some embodiments, however, the control system is implemented as a software package, which can be adaptable to run on different platforms and operating systems as shall be described further herein. In particular, a preferred embodiment of the control system, which comprises an ordered listing of executable instructions for implementing logical functions, can be embodied in any computer-readable medium for use by or in connection with an instruction execution system, apparatus, or device, such as a computer-based system, processor-containing system, or other system that can fetch the instructions from the instruction execution system, apparatus, or device, and execute the instructions. In the context of this document, a "computer-readable medium" can be any means that can contain, store, communicate, propagate or transport the program for use by or in connection with the instruction execution system, apparatus, or device.

The computer-readable medium can be, for example, but is not limited to, an electronic, magnetic, optical, electromagnetic, infrared, or semi-conductor system, apparatus, device, or propagation medium. More specific examples (a non-exhaustive list) of the computer-readable medium would include the following: an electrical connection (electronic) having one or more wires, a portable computer diskette (magnetic), a random access memory (RAM) (magnetic), a read-only memory (ROM) (magnetic), an erasable, programmable, read-only memory (EPROM or Flash memory) (magnetic), an optical fiber (optical), and a portable compact disk read-only memory (CDROM) (optical). Note that the computer-readable medium could even be paper or another suitable medium upon which the program is printed, as the program can be electronically captured, via for instance, optical scanning of the paper or other medium, then compiled, interpreted, or otherwise processed in a suitable manner, if necessary, and then stored in a computer memory.

Figure 8:
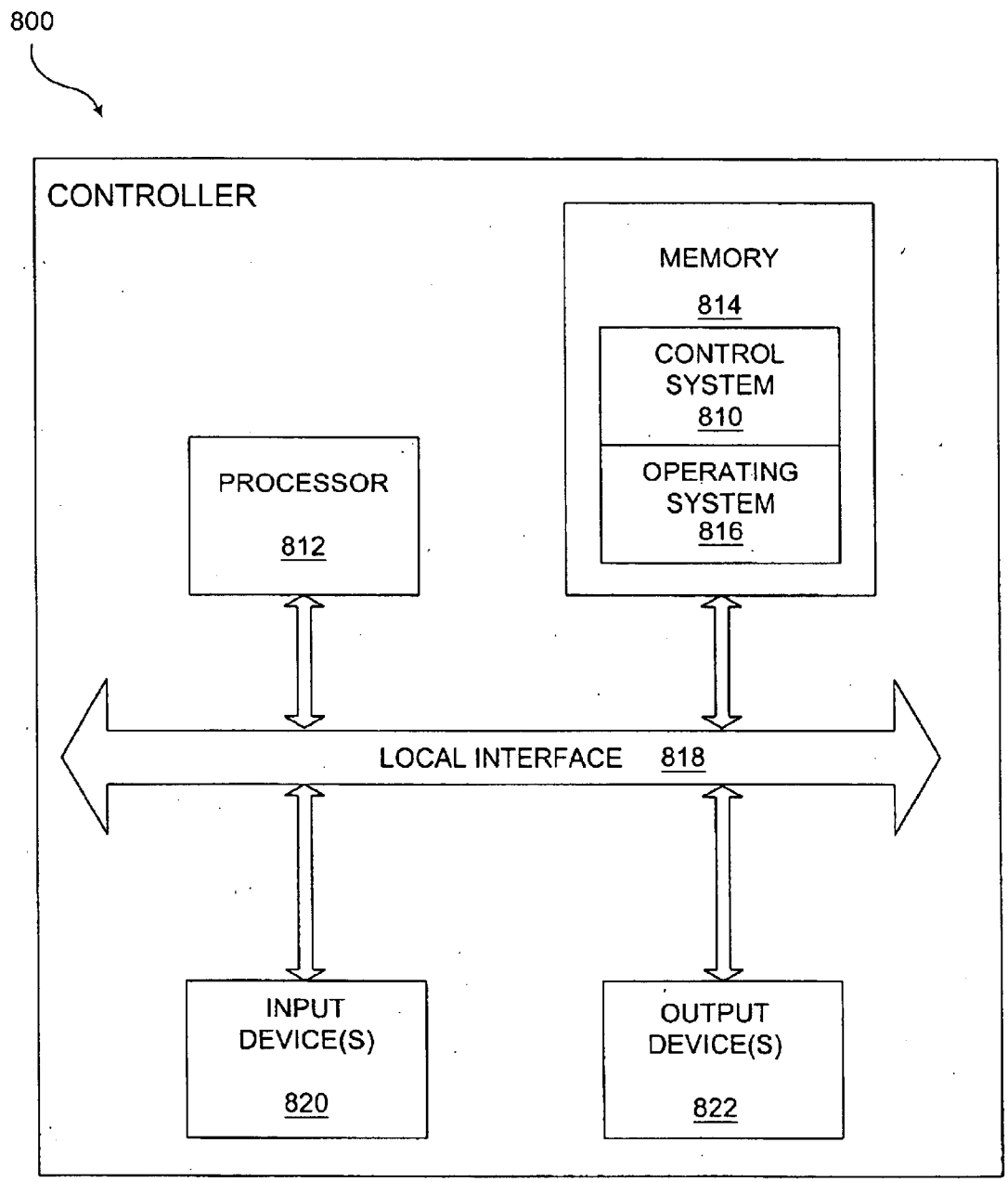
FIG. 8 is a schematic diagram depicting a representative computer or processor-based system which may be used to implement an embodiment of a control system.

FIG. 8 illustrates a typical computer or processor-based system that may facilitate functionality of the control system 810 (described in detail hereinafter) of the present invention, and thereby may be employed as a controller, e.g., control system 810 of FIG. 7. As shown in FIG. 8, the computer system generally comprises a processor 812 and a memory 814 with an operating system 816. Herein, the memory 814 may be any combination of volatile and nonvolatile memory elements, such as random access memory or read only memory. The processor 812 accepts instructions and data from memory 814 over a local interface 818, such as a bus(es). The system also includes an input device(s) 820 and an output device(s) 822. Examples of input devices may include, but are not limited to, a serial port, a scanner, or a local access network connection. Examples of output devices may include, but are not limited to, a video display, a Universal Serial Bus, or a printer port. The control system 810 of the present invention, the functions of which shall be described hereinafter, resides in memory 814 and is executed by the processor 812.

Figure 9:
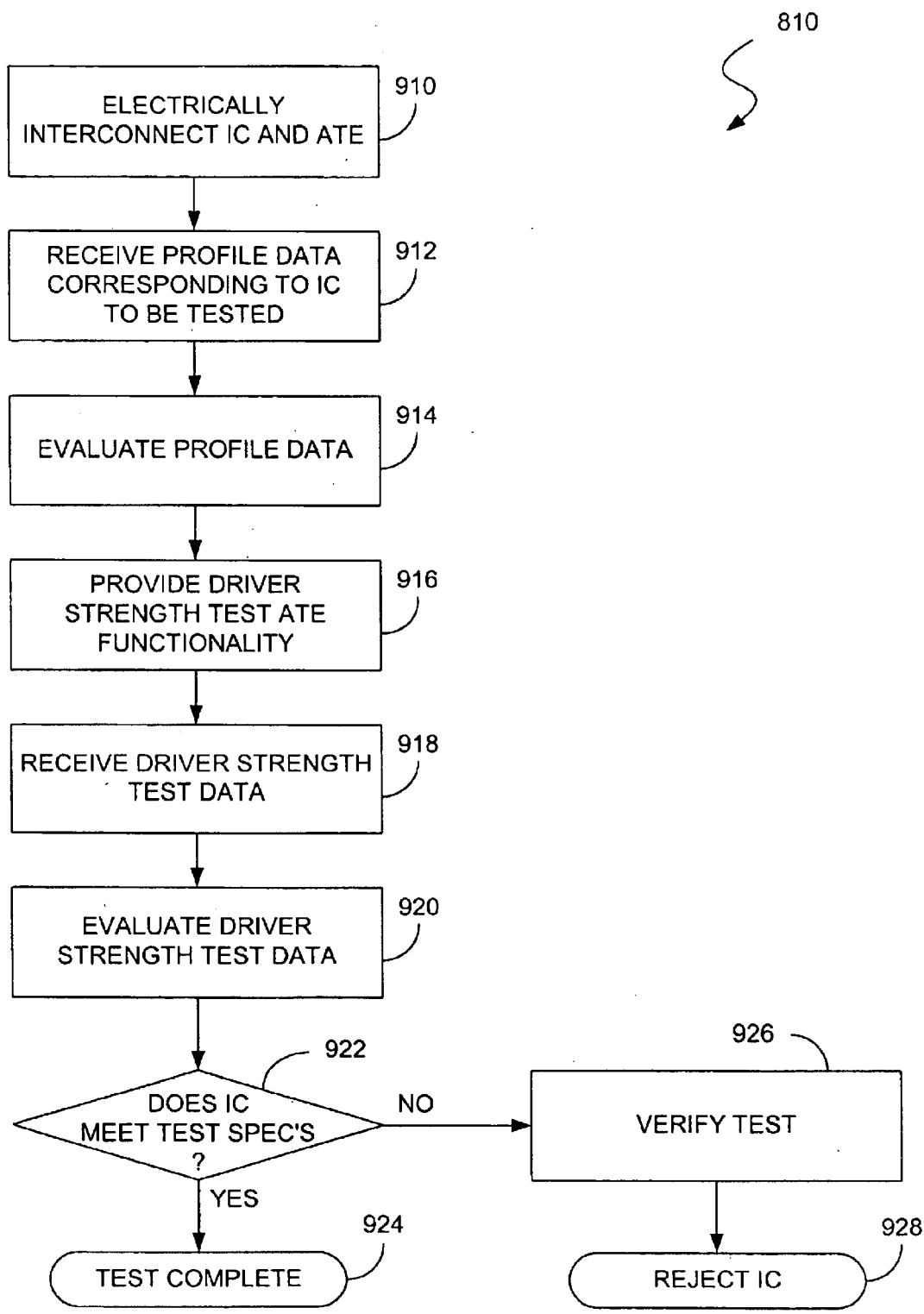
FIG. 9 is a flowchart depicting the functionality of an embodiment.

The flowchart of FIG. 9 shows the functionality and operation of an implementation of the control system 810 depicted in FIG. 8. In this regard, each block of the flowchart represents a module segment or portion of code which comprises one or more executable instructions for implementing the specified logical function or functions. It should also be noted that in some alternative implementations the functions noted in the various blocks may occur out of the order depicted in FIG. 9. For example, two blocks shown in succession in FIG. 9 may, in fact, be executed substantially concurrently where the blocks may sometimes be executed in the reverse order depending upon the functionality involved.

As depicted in FIG. 9, the control system 810 (or method) may be construed as beginning at block 910 where an IC to be tested is electrically interconnected with ATE. Proceeding to block 912, profile data corresponding to the IC to be tested may be received. Such profile data may include, but is not limited to, information relating to the type of IC and/or electrical continuity information corresponding to the interconnection of the ATE and the IC, among others. The profile data may be provided in numerous manners, such as by being provided in the form of an operator input at a work station or as a response to a test initiation signal delivered to the analog test circuitry by the ATE, for instance. After receiving the profile data, if applicable, the process preferably proceeds to block 914 where the data is evaluated, i.e., a determination is made as to whether testing may proceed.

At block 916, the IC under test is provided, by the ATE, with appropriate signals to facilitate driver strength testing. At block 918, test data is received, such as by the ATE, with the data being received in any suitable manner, e.g., intermittently throughout the testing cycle, or after testing has been completed. At block 920, where driver strength data is evaluated and, then, in block 922, a determination may be made as to whether the driver and its associated components are functioning as desired. If it is determined that the driver strength is not as desired, the process may proceed to block 926 where the test results may be verified, such as by repeating at least some of the aforementioned process steps 910–922. Thereafter, if the determination once again is made that the integrated circuit is not functioning as desired, the process may proceed to block 928 where the integrated circuit may be rejected. If, however, it is determined that the integrated circuit is functioning as desired, the process may proceed to block 924 where the process may terminate.

As is known, when ATE is used to test an integrated circuit, the ATE should be calibrated to ensure that it is providing accurate measurements. As the present invention provides at least selected ATE functionality, calibration of the driver strength test circuitry also should be performed. Typical prior art solutions for addressing the issues of calibration have included: designing test circuitry to be self-calibrating; designing test circuitry to be invariant to process, voltage, and temperature (PVT); and not calibrating the test circuitry at all. In regard to self-calibrating test circuitry, such a technique potentially causes the disadvantage of increasing the size of the test circuitry to a size where use of such circuitry within an integrated circuit is no longer practical. In regard to designing the test circuitry to be invariant to PVT, providing such invariance is effectively not possible. For instance, heretofore, a typical solution has been to make any PVT variance easily characterizable and predictable. Additionally, this technique also may cause the size of the circuitry to increase to a point where its use is no longer practical. In regard to deliberately failing to calibrate test circuitry, obviously, such a technique may result in test circuitry producing inaccurate results which may lead to an increase in the number of improperly functioning integrated circuits being shipped or may cause an increase in the number of properly functioning integrated circuits which are rejected from being shipped.

Figure 10:
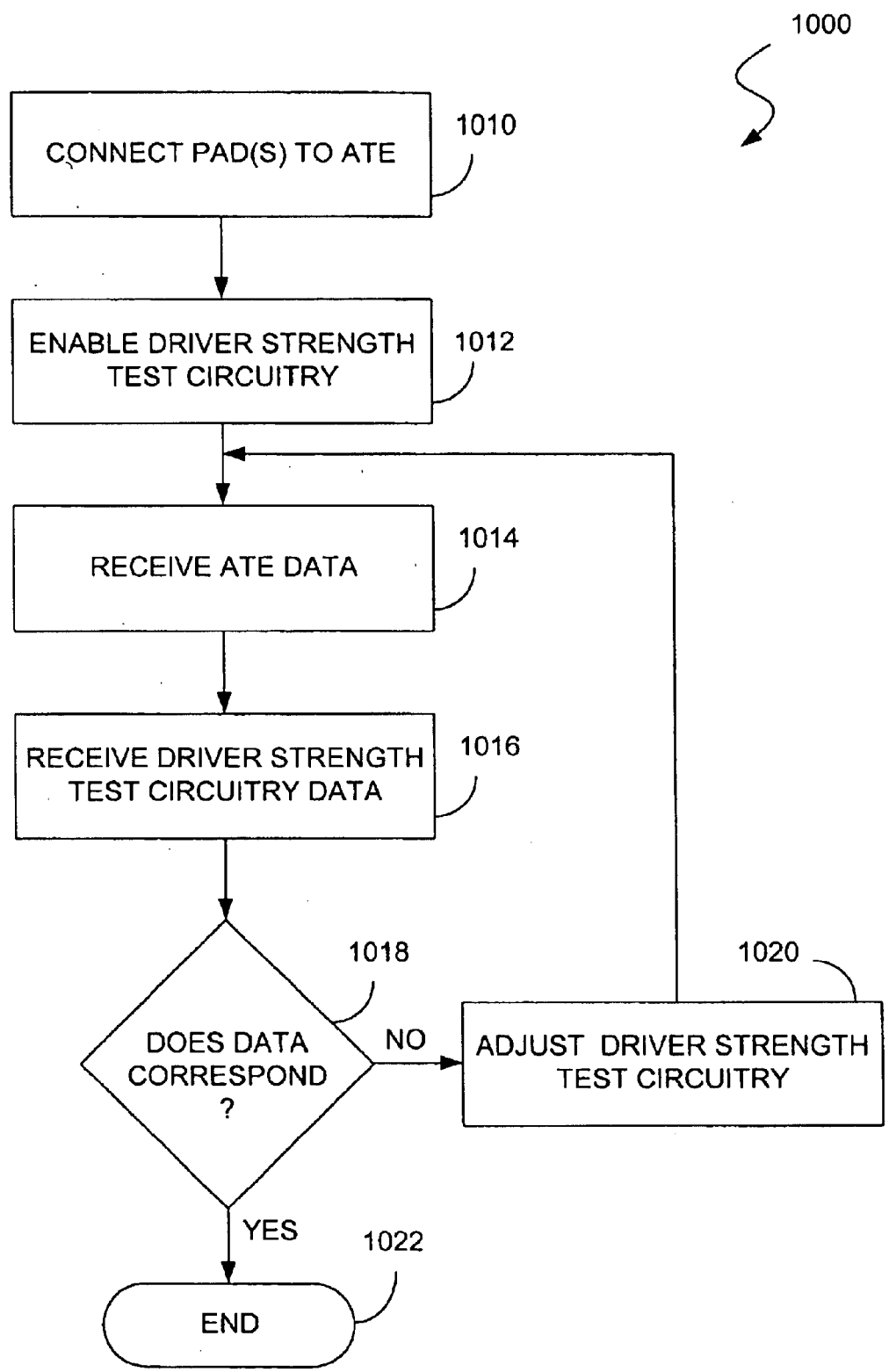
FIG. 10 is a flowchart depicting the functionality of an embodiment.

Since it is preferable to calibrate test circuitry, e.g., driver strength test circuitry, the following calibration method is provided for the purpose of illustration, and not for the purpose of limitation. As shown in FIG. 10, a method 1000 for calibrating driver strength test circuitry preferably begins at block 1010 where designated pads of an integrated circuit to be tested are connected to ATE. Preferably, when a circuit design, e.g., a pad, is used multiple times within an IC, identical driver strength test circuitry is associated with each instance of that circuit design. When so configured, connecting of the pads to the ATE, such as depicted in block 1010, preferably includes merely connecting the ATE to one or more instances of the circuit design. Since different instances of the repeated circuit design are assumed to be identical in their defect-free electrical behavior, measurements made on the ATE-connected instance of the circuit design may be assumed to correlate to the measurements made at other (non-connected) instances of that circuit design. It should be noted, however, that since each identical instance of the block is assumed to have identical defect-free electrical behavior, only one ATE-connected pad of each pad type need be utilized, although additional ones of the pads may be utilized for added error detection and comparison.

Proceeding to block 1012, driver strength test circuitry is enabled. With both ATE and the appropriate driver strength test circuitry now enabled, measurements may be taken by either or both of the ATE and the driver strength test circuitry. Thus, as depicted in blocks 1014 and 1016, the process includes the steps of receiving ATE measurements and receiving driver strength test circuitry measurements, respectively. At block 1018, a determination may be made as to whether the ATE measurement data and the driver strength test circuitry data appropriately correspond, thereby indicating proper calibration of the driver strength test circuitry. If, however, it is determined that the measurements do not correspond, the process may proceed to block 1020 where the receiver test circuitry measurements may be adjusted to match those measurements obtained from the ATE. Thereafter, the process may proceed back to block 1014 and proceed as described hereinbefore until the driver strength test circuitry measurements are appropriately calibrated. Once appropriate calibration has been achieved, the process may end, such as depicted in block 1022.

Receiver Termination Testing

Additionally or alternatively, embodiments of the test circuitry can facilitate receiver termination testing of pads of integrated circuits. In this regard, typical pad receiver circuits are implemented with several parallel transistors that are used to establish the termination impedance of the receiver.

Figure 11:
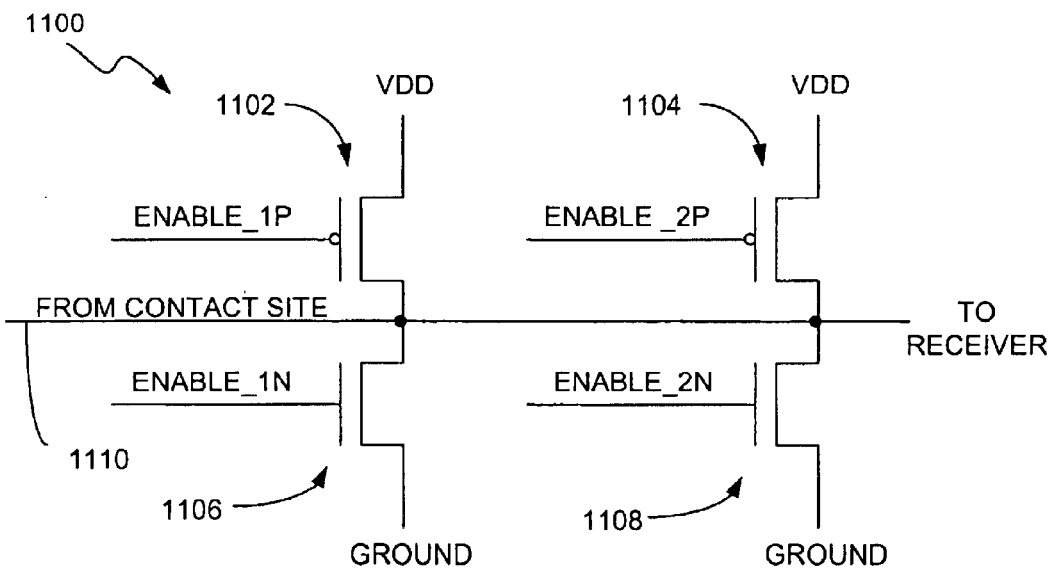
FIG. 11 is a schematic diagram depicting detail of an embodiment of a receiver circuit.

In the embodiment of FIG. 11, termination circuit 1100 includes two P-type termination transistors 1102 and 1104, and two N-type termination transistors 1106 and 1108, all of which are gated by "ENABLE" signals. Each of the P-transistors 1102 and 1104 is coupled between a respective power source and the input 1110. Each of the N-transistors 1106 and 1108 is coupled between input 1110 and ground. These transistors serve to establish a termination impedance for the input 1110 on its way to the receiver circuit.

Figure 12A:
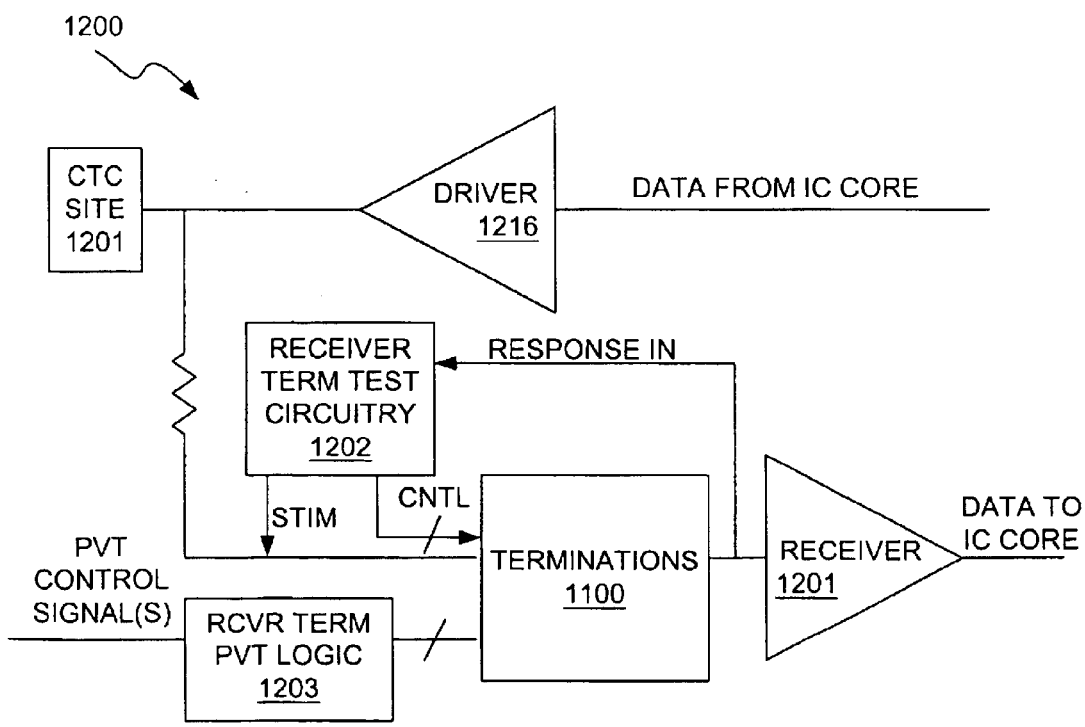
FIG. 12A is a schematic diagram of an embodiment of a pad including receiver termination test circuitry.

Reference will now be made to FIG. 12A, which depicts an embodiment of an integrated circuit of the present invention. As shown in FIG. 12A, pad 1200 includes a contact site 1201 driven by a pad driver 1216. Contact site 1201 also is connected to termination circuit 1100, as well as receiver 1210. The termination circuit 1100 is controlled in normal operation by a PVT control circuit 1203. An embodiment of receiver termination test circuitry 1202 is connected such that may provide data stimulus as well as control information to the termination circuit 1100. In addition, the response information is returned to the test circuitry 1202. The details of the test circuitry will be presented with respect to FIG. 12B.

Figure 12B:
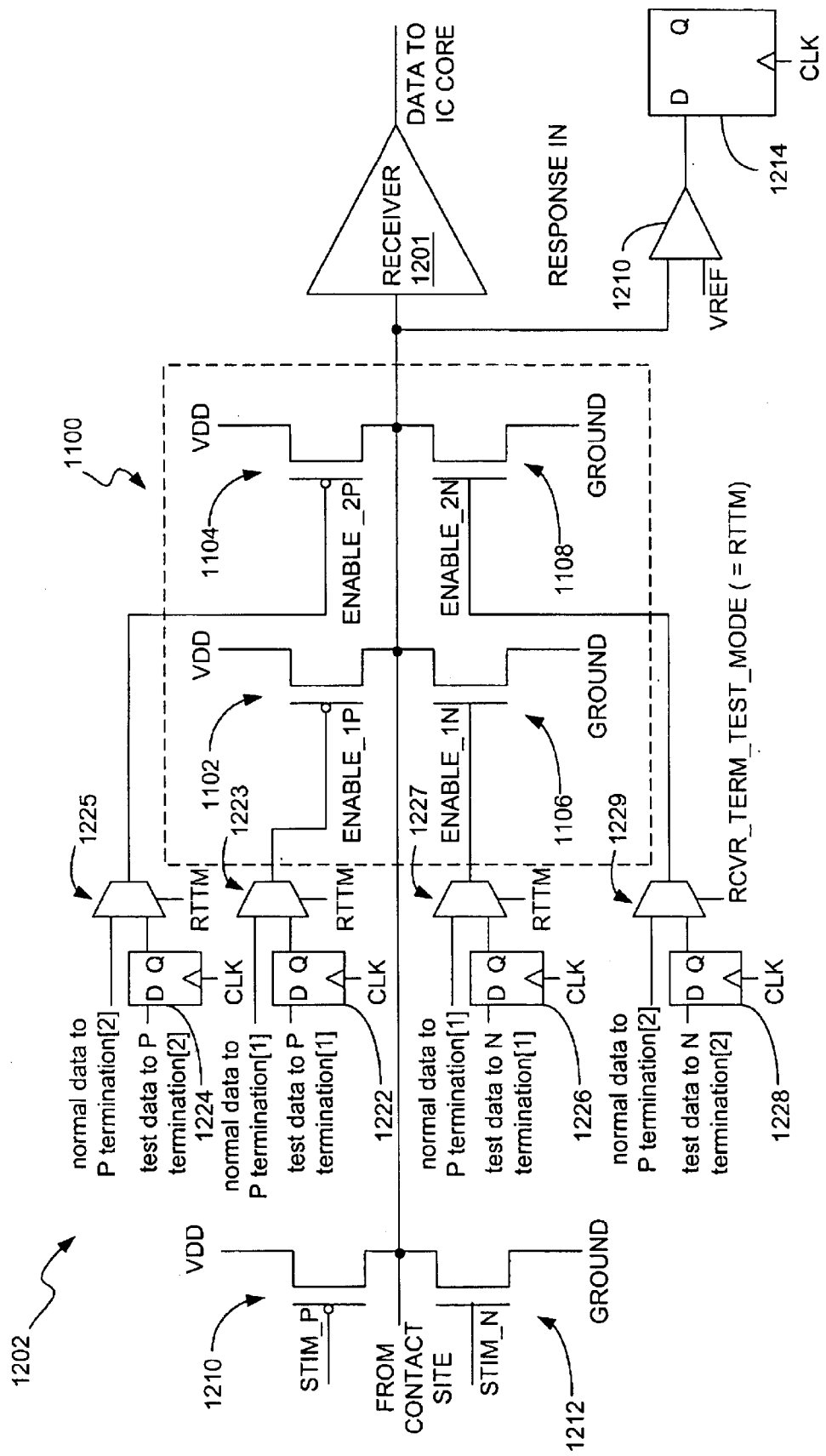
FIG. 12B is schematic diagram of an embodiment of receiver termination test circuitry.

An embodiment of the receiver termination test circuitry 1202 is shown in FIG. 12B. Note, FIG. 12B includes an example of the termination circuit 1100 that is being tested. This particular termination circuit contains four transistors, two P-type and two N-type, so the receiver test circuitry produces four control signals that will be connected to the gates of the termination transistors. For example, multiplexer 1225 is electrically coupled to the gate of termination pull-up transistor 1104. When the receiver termination test circuitry is activated by the signal labeled RTTM (RCVR_TERM_TEST_MODE), multiplexer 1225 causes the gate of transistor 1104 to be connected to flip-flop 1224, which will control whether or not transistor 1104 is conducting or tristated. Similarly, the RTTM signal selects the source of data for transistors 1102, 1106 and 1108 to be flip-flops 1222, 1226 and 1228, respectively, via multiplexers 1223, 1227 and 1229, respectively. The intent of these control mechanisms is to enable only one of the termination transistors, while holding the others in their tristate condition.

The receiver termination test circuitry 1202 may also contain transistors 1210 and 1212, one P-type (1210) and one N-type (1212), that are capable of providing stimulus to the termination circuit 1100. If a P-type termination transistor, such as 1102 or 1104, is selected to be tested, then the N-type stimulus transistor 1212 is activated by setting the STIM_N signal to logic 1. If an N-type termination transistor, such as 1106 or 1108, is selected to be tested, then the P-type stimulus transistor 1210 is activated by setting the STIM_P signal to logic 0. Only one of the transistors 1210 and 1212 is active at a time, and they are sized such that the ratioed logic contention that results between the stimulus transistor and the termination transistor has a predictable result. This voltage divider is observed at both the input to the mission-mode receiver 1201 and the test receiver 1210. This embodiment of test receiver 1210 provides for a differential comparator between the RESPONSE IN signal and a reference voltage, VREF. The digital result of this comparison may be captured in flip-flop 1214 for later observation.

The test procedure may be described as follows. In order to set a desired impedance of the receiver termination circuit 1100, the termination transistors of the receiver, i.e., the transistors 1102, 1104, 1106 and 1108, are selectively enabled. Test circuitry 1202 is used to determine whether one or more of the termination transistors of the receiver are operable. This is accomplished by enabling either the driver pull-up transistor 1210 or the driver pull-down transistor 1212, along with the selected complementary termination transistor 1102, 1104, 1106, or 1108, and determining an output of the receiver 1100.

By way of example, in order to determine whether termination transistor 1106 of the receiver is operative, transistors 1102, 1104 and 1108 are disabled, and transistor 1106 is enabled. Driver pull-up transistor 1210 also is enabled so that the output of pull-up transistor 1210 is provided to the input of receiver 100. Since the strength of the pull-up transistor 1210 is selected so that it is not sufficient to overcome the strength of the transistor 1106, transistor 1106 should drive the output of the receiver to logic 0 if transistor 1106 is functioning properly. This output should be captured in the scan register 1214. If, however, transistor 1106 is not functioning properly, the output of transistor 1210 should be sufficient to drive the output of the receiver to logic 1, which also should be captured in the scan register 1214.

In order to test a pull-up termination transistor of receiver termination circuit 1100, such as transistor 1102, all of the other termination transistors of the receiver are disabled and transistor 1102 is enabled. The driver pull-down transistor 1212 then is enabled. Since the strength of the pull-down transistor 1212 is not sufficient to overcome the strength of the transistor 1102 if that transistor is functioning properly, the output of the receiver captured by the scan register 1214 should be logic 1 if the transistor 1102 is functioning properly. However, if the transistor 1102 is not functioning properly, the output captured at the scan register 1214 should be logic 0.

Figure 12C:
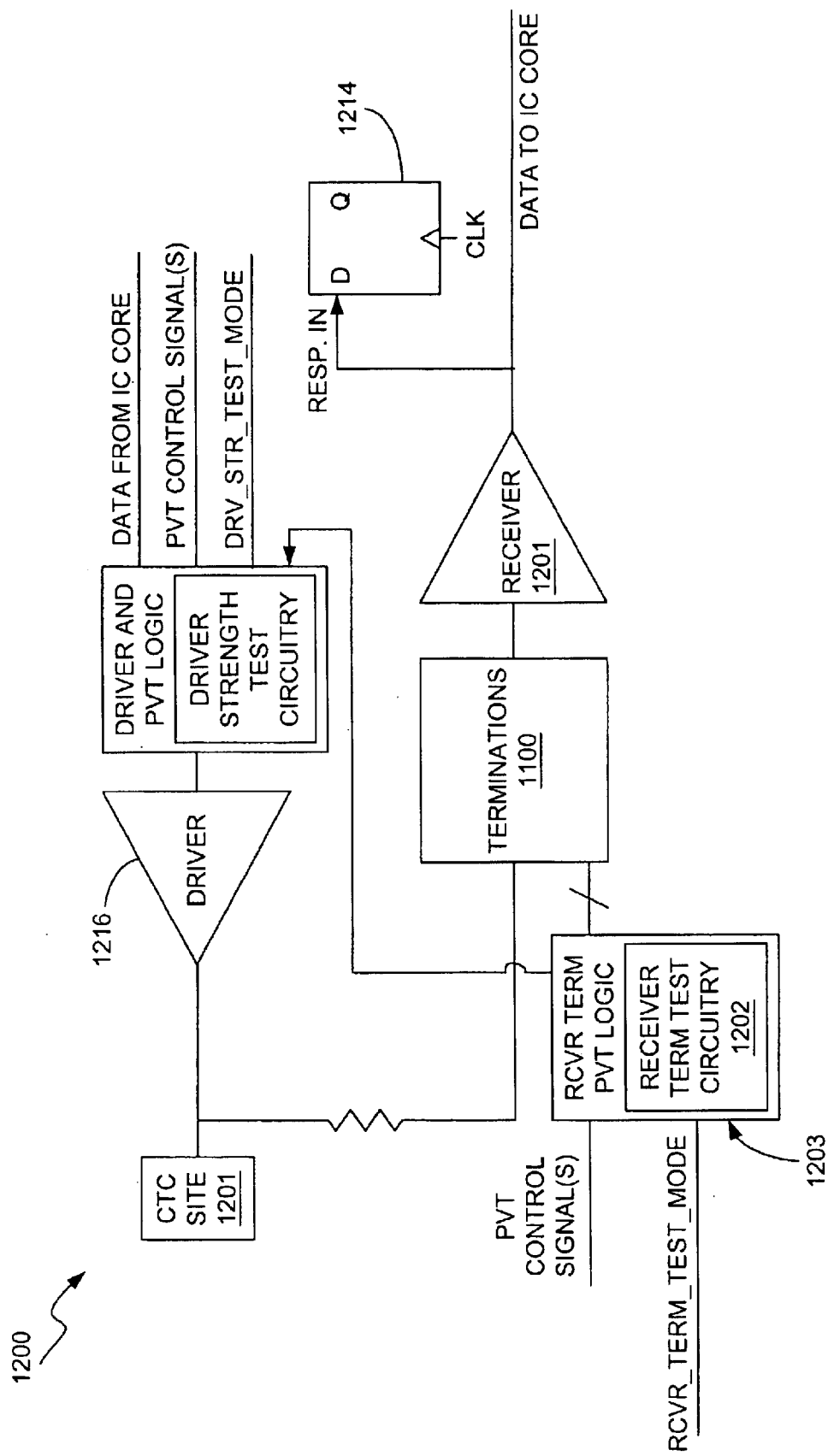
FIG. 12C is a schematic diagram depicting another embodiment of a pad with simplified receiver termination test circuitry.

An alternative embodiment of the receiver termination test circuitry in the context of a pad 1200 is shown in FIG. 12C, wherein significant circuit area savings are made possible by combining elements of the receiver termination test circuit 1202 with existing pad circuitry. In particular, the test circuitry in 1202 may be combined with the very similar PVT control circuitry in 1203. Also, the stimulus may be provided by the functional driver 1216 as controlled by the driver strength test circuitry described in FIGS. 6A–6F. Finally, the response may be observed by the mission-mode receiver 1201 and captured in flip-flop 1214. This final optimization restricts the voltage comparison to the trip point of the receiver 1201, which is typically near VDD/2. Therefore, the selection of the ratios of sizes between the stimulus transistors (which may be inside driver 1216) and the termination resistor being tested in 1100 should be done carefully to ensure a valid voltage input to the receiver.

In some implementations, the receiver PVT logic and test logic circuitry inside each pad are combined via multiplexers, such as described previously for driver strength testing with respect to FIG. 6B. A control signal then can be used to force the receiver into termination test mode. In this mode, the PVT control signals act as the test data for each transistor, thus reducing or eliminating the need for the scan registers for the test data. This can result in the circuit having a much lower area penalty. Some additional logic and/or scan registers may be required depending on the degree of flexibility desired for activating combinations of n- and p-transistors.

Also, in some implementations, such as depicted in FIG. 12C, the receiver circuit, e.g., receiver 1100, is used as a comparator so as not to incur any additional area penalty. In this configuration, scan register 1214 is used to capture the receiver output. Since each receiver typically has its own scan register (as per IEEE standard 1149.1), all the pads can be tested simultaneously. Such a use of the existing scan register also minimizes the area penalty by eliminating the need for a dedicated comparator (1210) and scan register, such as described previously with respect to FIG. 12B. However, this implementation relies on the fixed threshold of the receiver (usually near VDD/2) to distinguish logic 0 from logic 1.

Since the nature of a pad is to either drive or receive, but not both at the same time, pad designs may require extra logic to support at least some embodiments of the invention. Alternatively, one proposed change to the test environment can be made to allow pairs of pads to be tested with relatively little change to the pad circuitry, as shown in FIG. 12D.

Figure 12D:
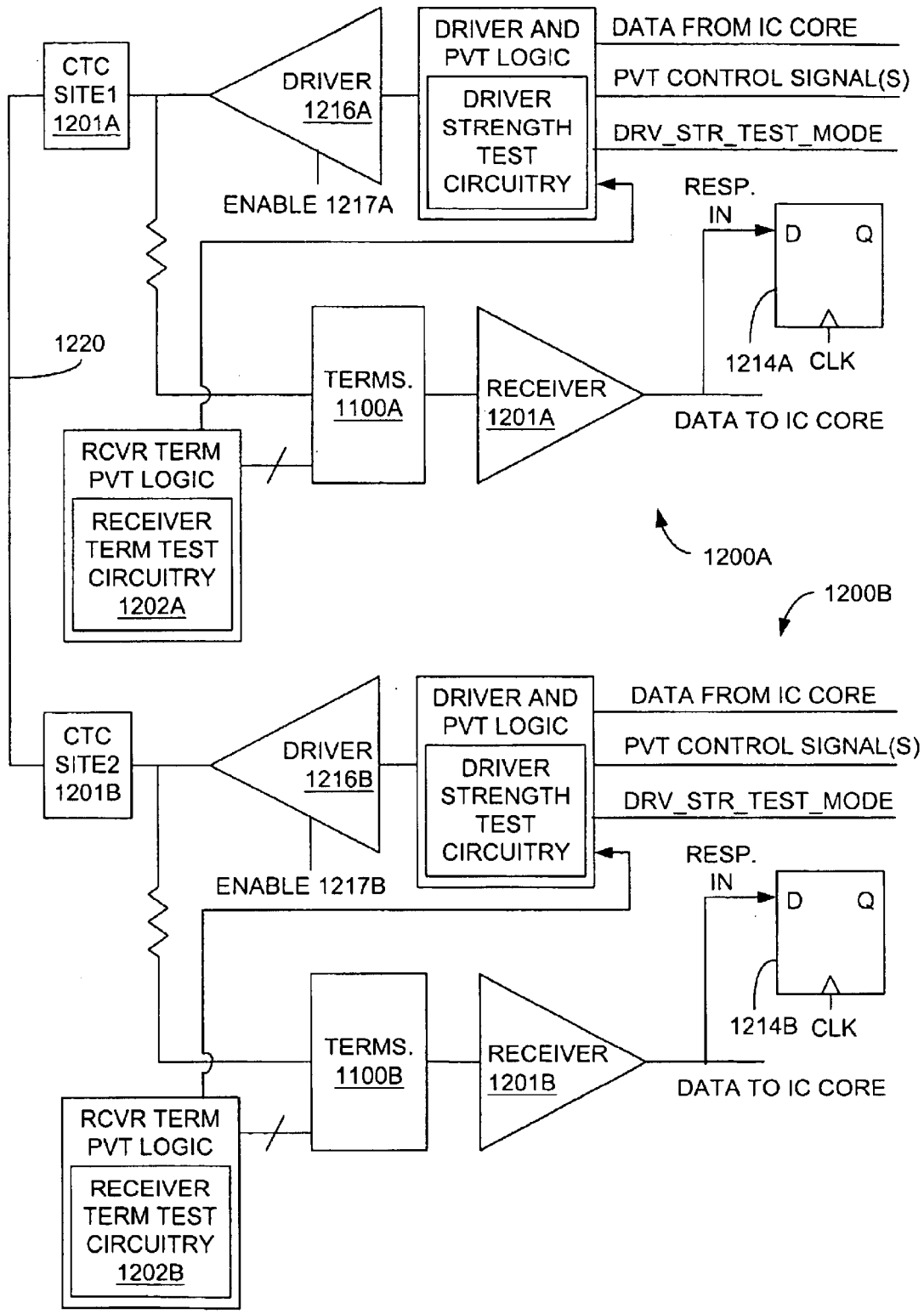
FIG. 12D is a schematic diagram depicting electrically intertwined pads of an embodiment.

In FIG. 12D, two pads, e.g., pads 1200A and 1200B, of the same circuit type are connected externally with a jumper wire 1220. An inter-pad receiver pull-down termination test can then be obtained by selecting a p-transistor (or set of p-transistors) in a given driver (1216A, for example). An n-transistor (or set of n-transistors) in the jumpered receiver termination circuit also is selected (1100B, for example), the resistance of which is less than that of the p-network by a specified margin. Data is then scanned into the scan registers in the test circuitry that will activate the chosen transistors. The voltage of the output node then can be compared with a reference voltage (VDD/2 in this example). The output of receiver 1201B can be sampled into scan register 1214B and observed (should be logic 0 in this example).

An inter-pad receiver pull-up termination test can be obtained by selecting an n-transistor (or set of n-transistors) in a given driver (1216A, for example). A p-transistor (or set of p-transistors) in the jumpered receiver termination circuit is also selected (110B, for example), the resistance of which is less than that of the n-network by a specified margin. Data is then scanned into the scan registers in the test circuitry that will activate the chosen transistors. The voltage of the output node then can be compared with a reference voltage (VDD/2 in this example), and the output of receiver 1201B can be sampled into scan register 1214B and observed (should be logic 1 in this example).

Since this type of receiver termination testing can cause logic contention, driver and termination design should be done with care to assure that the high currents involved do not cause damage to the circuitry. As a cautionary measure, the jumper wire described with respect to FIG. 12D can be replaced with a current limiting resistor. Note that the calculations for the output voltages at pad 1200A and pad 1200B nodes should take this resistance into account in order to predict the correct results.

Note that, in the some implementations, the trip level of the receiver is generally fixed at VDD/2, which could limit the number of data points from logic contentions that can be gathered compared to the more general comparator solution. One easily-implemented extension to the preferred implementation is the use of a receiver with hysteresis that extends the range of voltage levels that can be used in resolving contentions between other combinations of p- and n-transistors.

When an IC has a high pin count, it is overwhelmingly likely that there are many occurrences of the same pad driver circuit type used for different signals. The present invention can make use of that fact to assess the accuracy of the receiver termination measurement circuit. If one signal connected to a given pad termination circuit type is contacted by ATE, the PMU can be used to accurately measure the current sourcing and sinking abilities of the pullup and pulldown receiver termination transistors, respectively. These values will be largely identical for all other copies of this pad type, subject only to the variation of the IC process, which tends to be small in any given area of the circuit. Thus, for a group of pad termination circuits of a given type that are near each other in the circuit, the measurement of one ATE-contacted member can be used to reliably infer the values for the other non-contacted members, thereby allowing the pass/fail results from the scan registers sampling the pad voltages of non-contacted pads to represent actual termination specification values.

Figure 12E:
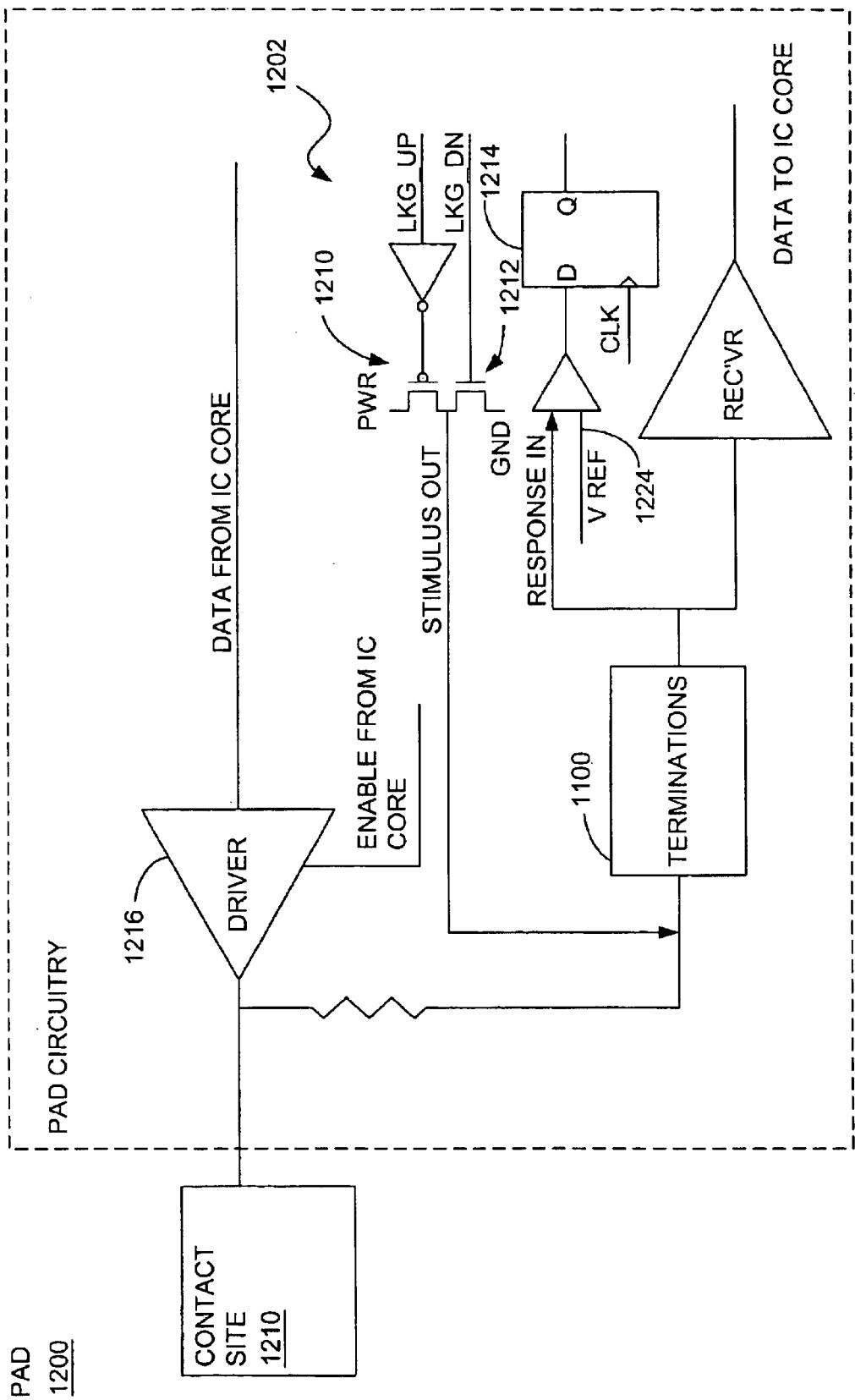
FIG. 12E is a schematic diagram depicting an alternative embodiment.

Referring now to FIG. 12E, another embodiment of receiver termination test circuitry will be described in greater detail. As depicted in FIG. 12E, receiver termination test circuitry 1202 is based on a simple ratioed-logic circuit that re-uses the tristate leakage circuit described in FIG. 6E. More specifically, a small transistor (either p-type transistor 1210 or n-type transistor 1212) is activated to oppose the receiver termination current, and the resulting voltage is compared to a reference 1224 by a comparator 1226, with the result of the comparison being captured in a scan register 1214 for later observation.

To test for the presence of the receiver termination's pull-up device(s), the driver 1216 is disabled and a pull-down type transistor 1212 is activated by a test signal ("lkg__dn") tied to its gate. This n-type type transistor is very small, such that its on-resistance is surpassed by the on-resistance of the large p-type receiver termination transistor, but a missing receiver termination transistor would be indicated if the lkg__dn transistor were able to cause a logic 0 to appear in scan register 1214.

To test for the presence of the receiver termination's pull-down device(s), the driver 1216 is disabled and a pull-up p-type transistor 1210 is activated by the inverse of a test signal ("lkg__up") tied to its gate. This p-type transistor is very small, such that its on-resistance is surpassed by the on-resistance of the large n-type receiver termination transistor, but a missing receiver termination transistor would be indicated if the lkg__up transistor were able to cause a logic 1 to appear in scan register 1214.

Figure 12F:
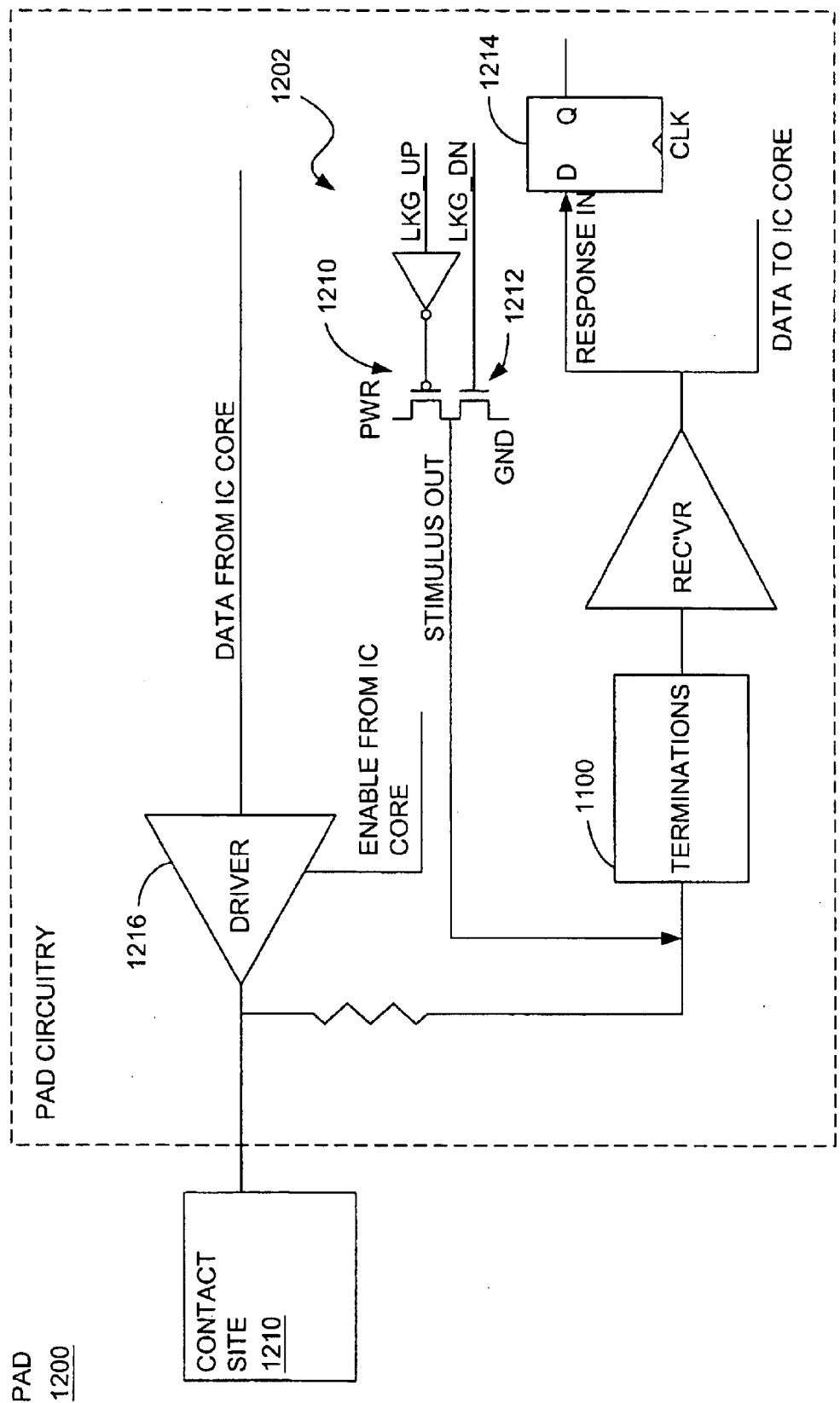
FIG. 12F is a schematic diagram depicting another alternative embodiment.

In some implementations, the receiver circuit is used as the comparator so as not to incur any additional area penalty. FIG. 12F is a schematic diagram depicting such an implementation. In this configuration, the scan register associated with the receiver is used to capture the receiver output. Since each receiver typically has its own scan register (as per IEEE standard 1149.1), all the pads can be tested simultaneously.

The foregoing description has been presented for purposes of illustration and description. It is not intended to be exhaustive or to limit the scope of the claims to the precise forms disclosed. Modifications or variations are possible in light of the above teachings. The embodiments discussed, however, were chosen and described to enable one of ordinary skill in the art to utilize various embodiments. All such modifications and variations are within the scope of the appended claims when interpreted in accordance with the breadth to which they are fairly and legally entitled.

What is claimed is:

1. A method for testing an integrated circuit (IC), the IC having a first pad configured as a signal interface for components external to the IC, the first pad having a receiver configured to receive an input signal from a component external to the IC, said method comprising:

electrically interconnecting automated test equipment (ATE) with the IC;

providing at least one stimulus to the IC such that the IC measures a receiver termination characteristic of the first pad; and receiving information corresponding to the receiver termination characteristic of the first pad.

2. The method of claim 1, wherein the receiver has at least a first P-type transistor and at least a first N-type transistor, and the IC has at least one other N-type transistor; and further comprising:

disabling the first N-type transistor of the receiver;

activating at least the first P-type transistor of the receiver;

activating at least the other N-type transistor of the IC; and determining whether an output of at least the first P-type transistor is greater than an output of at least the other N-type transistor.

3. The method of claim 2, wherein the IC has at least one other P-type transistor; and further comprising:

disabling the first P-type transistor of the receiver;

activating at least the first N-type transistor of the receiver;

activating at least the other P-type transistor the IC: and determining whether an output of a least the first N-type transistor is greater than an output of at least the other P-type transistor.

4. The method of claim 2, wherein multiple iterations of the determining are performed using different combinations of P-type and N-type transistors.

5. The method of claim 1, wherein the IC has a second pad; and wherein providing at least one stimulus comprises:

electrically interconnecting the first pad with a second pad of the IC; and providing the at least one stimulus such that the IC measures a receiver termination characteristic of the second pad.

6. The method of claim 1, wherein the IC includes a scan register; and wherein the information received is captured by the scan register.

7. The method of claim 1, wherein providing at least one stimulus comprises:

providing the at least one stimulus from the ATE.

8. The method of claim 1, wherein the IC has a plurality of pads, and wherein electrically interconnecting automated test equipment (ATE) with the IC comprises electrically interconnecting the ATE to a subset of the plurality of pads.

9. The method of claim 1, wherein the first pad has a driver configured to provide an output signal to a component external to the IC.

10. The method of claim 9, further comprising:

measuring driver strength of the first pad at the IC in response to the at least one stimulus.

11. An integrated circuit (IC) comprising:

a first pad electrically communicating with at least a portion of said IC, said first pad having a first receiver configured to receive a first pad input signal from a component external to said IC and to provide, to a component internal to said IC, a first receiver digital output signal in response to the first pad input signal; and a first test circuit internal to said IC and being adapted to provide information corresponding to a receiver termination characteristic of the first pad.

12. The IC of claim 11, wherein:

the receiver has at least a first P-type transistor and at least a first N-type transistor;

the IC has at least one other N-type transistor; and the first test circuit is operative to:
  disable the first N-type transistor of the receiver;
  activate at least the first P-type transistor of the receiver;
  activate at least the other N-type transistor of the IC; and
  determine whether an output of at least the first P-type transistor is greater than an output of at least the other N-type transistor.

13. The IC of claim 11, wherein:

the receiver has at least a first N-type transistor and at least a first P-type transistor;

the IC has at least one other P-type transistor; and the first test circuit is operative to:
  disable the first P-type transistor of the receiver;
  activate at least the first N-type transistor of the receiver;
  activate at least the other P-type transistor of the IC; and
  determine whether an output of at least the first N-type transistor is greater than an output of at least the other P-type transistor.

14. The IC of claim 11, further comprising a scan register electrically communicating with the receiver and operative to capture the output of the receiver.

15. The IC of claim 11, wherein the first pad has a driver configured to provide an output signal to a component external to the IC.

16. The IC of claim 15, wherein the first test circuit is operative to measure driver strength of the first pad at the IC.

17. An integrated circuit (IC) comprising:

a first pad electrically communicating with at least a portion of said IC, said first pad having a first receiver configured to receive a first pad input signal from a component external to said IC and to provide, to a component internal to said IC, a first receiver digital output signal in response to said first pad input signal; and means for providing information corresponding to a receiver termination characteristic of the first pad.

18. A system for testing an integrated circuit, said system comprising:

automated test equipment (ATE) configured to electrically interconnect with an IC and to provide at least one stimulus to the IC; and an integrated circuit (IC) having a first pad, said first pad having a first receiver and a first test circuit, said first receiver being configured to receive a first pad input signal from said ATE and to provide, to a component internal to said IC, a first receiver digital output signal in response to said first pad input signal, said first test circuit being configured to electrically communicate with said ATE such that, in response to receiving said at least one stimulus from said ATE, said first test circuit provides information, corresponding to a receiver termination characteristic of said first receiver of said first pad, to said ATE.

19. The system of claim 18, wherein said IC has a plurality of pads, said ATE is configured to electrically interconnect with a subset of said plurality of pads, and said system is configured to measure a receiver termination characteristic of each receiver of each of said plurality of pads while said ATE is electrically interconnected with said subset of pads.

20. The system of claim 18, wherein:

the first pad has a driver configured to provide an output signal to a component external to the IC; and the first test circuit is operative to measure driver strength of the first pad at the IC.

* * * * *